(12) United States Patent
Nishimura et al.

(10) Patent No.: US 8,895,229 B2
(45) Date of Patent: Nov. 25, 2014

(54) COMPOSITION FOR FORMATION OF UPPER LAYER FILM, AND METHOD FOR FORMATION OF PHOTORESIST PATTERN

(75) Inventors: Yukio Nishimura, Tokyo (JP); Norihiko Sugie, Tokyo (JP); Hiromitsu Nakashima, Tokyo (JP); Norihiro Natsume, Tokyo (JP); Daita Kouno, Tokyo (JP)

(73) Assignee: JSR Corporation, Tokyo (JP)

( * ) Notice: Subject to any disclaimer, the term of this patent is extended or adjusted under 35 U.S.C. 154(b) by 599 days.

(21) Appl. No.: 12/445,152

(22) PCT Filed: Oct. 11, 2007

(86) PCT No.: PCT/JP2007/069858
§ 371 (c)(1),
(2), (4) Date: Oct. 6, 2009

(87) PCT Pub. No.: WO2008/047678
PCT Pub. Date: Apr. 24, 2008

(65) Prior Publication Data
US 2010/0021852 A1    Jan. 28, 2010

(30) Foreign Application Priority Data

Oct. 13, 2006  (JP) ................. 2006-279490
Feb. 1, 2007   (JP) ................. 2007-023574

(51) Int. Cl.
G03F 7/20 (2006.01)
G03F 7/30 (2006.01)
G03F 7/38 (2006.01)
G03F 7/11 (2006.01)

(52) U.S. Cl.
USPC ........ 430/311; 430/273.1; 430/325; 430/326; 430/327; 430/330; 430/907

(58) Field of Classification Search
None
See application file for complete search history.

(56) References Cited

U.S. PATENT DOCUMENTS

| 4,735,990 | A | 4/1988 | Kihara et al. | |
| 5,410,005 | A | 4/1995 | Nemoto et al. | |
| 2005/0233254 | A1 | 10/2005 | Hatakeyama et al. | |
| 2006/0024613 | A1 | 2/2006 | Otozawa et al. | |
| 2007/0254235 | A1* | 11/2007 | Allen et al. | 430/270.1 |
| 2008/0032202 | A1 | 2/2008 | Ishizuka et al. | |
| 2008/0038661 | A1 | 2/2008 | Chiba et al. | |
| 2008/0124524 | A1 | 5/2008 | Yoshimura et al. | |
| 2008/0311523 | A1 | 12/2008 | Endo et al. | |
| 2008/0311530 | A1* | 12/2008 | Allen et al. | 430/327 |

FOREIGN PATENT DOCUMENTS

| EP | 1950610 | 7/2008 |
| JP | 10-120968 | 5/1998 |
| JP | 11-176727 | 7/1999 |
| JP | 2005-264131 | 9/2005 |
| JP | 2006-47351 | 2/2006 |
| JP | 2006-64711 | 3/2006 |
| JP | 2006-91798 | 4/2006 |
| JP | 2006-335916 | 12/2006 |
| KR | 10-1994-0004384 | 3/1994 |
| KR | 10-2006-0048862 | 5/2006 |
| WO | WO 2006/035790 | 4/2006 |
| WO | WO 2006/059555 | 6/2006 |
| WO | WO 2007/049637 | 5/2007 |

OTHER PUBLICATIONS

Richard R. Thomas et al. Preparation and Surface Properties of Acrylic Polymers Containing Fluorinated Monomers. Macromolecules, 1997, pp. 2883-2890, vol. 30, No. 10.
Extended European Search Report for EP Application No. 07829596.1-2222/2078983, Jul. 28, 2010.
Report of Prior Art Search for corresponding KR Application No. 10-2009-7008996.

* cited by examiner

Primary Examiner — Sin J. Lee
(74) Attorney, Agent, or Firm — Oblon, Spivak, McClelland, Maier & Neustadt, L.L.P.

(57) ABSTRACT

A composition for formation of upper layer film, which is used for forming an upper layer film on the surface of a photoresist film and which comprises a resin (A) having a repeating unit represented by the following general formula (1-1) and not having a repeating unit represented by the following general formula (1-2), and a resin (B) having a repeating unit represented by the following general formula (1-2) and not having a repeating unit represented by the following general formula (1-1).

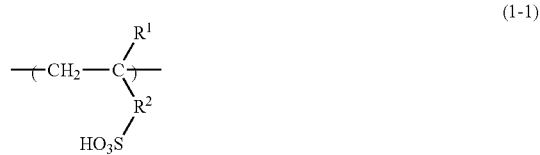

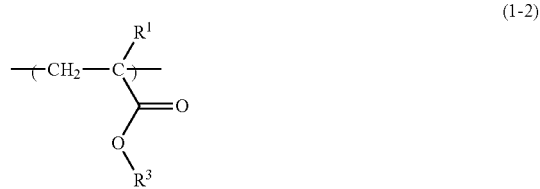

[In the general formulas (1-1) and (1-2), $R^1$ is hydrogen or the like; $R^2$ is single bonds or the like; and $R^3$ is a fluorine-substituted, linear or branched alkyl group having 1 to 12 carbon atoms, or the like.] The composition can form an upper layer film giving a sufficiently high receded contact angle.

5 Claims, 2 Drawing Sheets

COMPOSITION FOR FORMATION OF UPPER LAYER FILM, AND METHOD FOR FORMATION OF PHOTORESIST PATTERN

TECHNICAL FIELD

The present invention relates to a composition for formation of upper layer film, which is useful for forming an upper layer film capable of, in liquid immersion exposure conducted for finer lithography, protecting a photoresist film and suppressing the dissolution of photoresist film components to protect the lens of projection aligner, as well as to a method for formation of photoresist pattern using the composition for formation of upper layer film.

BACKGROUND ART

In producing a semiconductor element, etc., there is used a projection aligner of stepper type or step and scan type, which can transfer a reticle (a photomask) pattern onto the to-be-irradiated areas of a wafer having thereon a photoresist film (hereinafter referred to as "photoresist" in some cases) formed by coating, via a projection optical system. The projection optical system of projection aligner gives a higher resolution as the wavelength of the exposure ray used is shorter and the numerical aperture of the projection optical system is larger. Therefore, as the integrated circuit has become finer, the wavelength of exposure ray (which is the wavelength of the radiation used in projection aligner) has become shorter year by year and the numerical aperture of the projection optical system has become larger.

In conducting exposure, not only the resolution of projection optical system but also its depth of focus are important. The resolution R and the depth of focus δ are represented by the following formulas, respectively. In order to obtain a certain resolution R, use of a radiation of shorter wavelength can give a larger depth of focus δ.

$$R = k_1 \cdot \lambda / NA \quad (i)$$

$$\delta = k_2 \cdot \lambda / NA^2 \quad (ii)$$

(In the above formulas, λ is a wavelength of exposure ray; NA is a numerical aperture of projection optical system; and k1 and k2 are each a process coefficient.)

A photoresist film is formed on the wafer to be irradiated and a pattern is transferred onto this photoresist film. In conventional projection aligners, the space in which the wafer is placed, is filled with air or nitrogen. When the space between the wafer and the lens of projection aligner is filled with a medium of refractive index n, the above-shown resolution R and depth of focus δ are represented by the following formulas.

$$R = k_1 \cdot (\lambda/n) / NA \quad (iii)$$

$$\delta = k_2 \cdot n\lambda / NA^2 \quad (iv)$$

For example, in an ArF process, when water is used as the above medium and there is used n=1.44 (the refractive index of water in a ray of wavelength of 193 nm), the resolution R becomes 69.4% [R=k1·(λ/1.44)/NA] and the depth of focus becomes 144% (δ=k2·1.44λ/NA²), as compared with the exposure case of using air or nitrogen as a medium.

Such a projection exposure method in which the wavelength of a radiation to be applied is made shorter and a finer pattern can be transferred, is called liquid immersion exposure; and this liquid immersion exposure is considered to be an essential technique in conducting finer lithography, particularly lithography of several tens nm unit, and a projection aligner therefor is known (see Patent Document 1).

In the method of liquid immersion exposure using water as the medium, both the photoresist film formed on a wafer by coating and the lens of projection aligner come into contact with water. As a result, water penetrates into the photoresist film, which may lower the resolution of the photoresist. Further, components constituting the photoresist dissolve out into the water, which may stain the surface of the lens of the projection aligner.

In order to prevent the contact between the photoresist film and the medium (e.g. water), there is a method of forming an upper layer film (a protective film) on the photoresist film. However, this upper layer film is required to have properties such as mentioned below.

(1) It has sufficient transmission for the wavelength of the radiation used.
(2) It can be formed on a photoresist film while causing substantially no intermixing with the photoresist film.
(3) In liquid immersion exposure, it does not dissolve in the medium (e.g. water) used and can maintain a stable film state.
(4) It is easily soluble in a developing solution (e.g. an alkali solution).

As conventional relevant technical documents disclosed, there are Patent Document 2, Patent Document 3, etc.
Patent Document 1: JP-A-1999-176727
Patent Document 2: JP-A-2005-264131
Patent Document 3: JP-A-2006-64711

DISCLOSURE OF THE INVENTION

With the methods for formation of resist pattern, disclosed in the Patent Documents 2 and 3, there are expected suppressions in the defect of liquid droplets remaining on resist pattern (i.e. water mark defect), which is caused by the penetration of liquid filling medium into upper layer film and its remaining thereon, as well as in the defect of larger or smaller line width of resist pattern (i.e. inferior pattern defect). However, the above-mentioned upper layer film has had an insufficient receded contact angle in order to achieve a high scan speed in liquid-filled exposure. Specifically speaking, with the methods for formation of resist pattern, described in the Patent Documents 2 and 3, there can be expected the effective suppressions in water mark defect and inferior pattern defect and the formation of resist pattern of high resolution; however, there has been a fear that, with a higher scan speed, liquid droplets remain on the photoresist film owing to the insufficient receded contact angle of upper layer film and the remaining liquid droplets cause a water mark defect. Hence, an improvement is needed for the upper layer film to have a sufficiently high receded contact angle.

The present invention has been made in view of the above-mentioned problems of prior art. The present invention aims at providing a composition for formation of upper layer film, capable of forming an upper layer film which has sufficient transmission for the wavelength of exposure ray, particularly 248 nm (KrF) and 193 nm (ArF), which is formed on a photoresist film while causing substantially no intermixing with the photoresist film, which, in liquid immersion exposure, is highly insoluble in a liquid medium (e.g. water) and can maintain a stable film state, and which has a satisfactorily high receded contact angle and enables formation of a resist pattern of high resolution, that is, an upper layer film having such a receded contact angle that can effectively suppress the generation of water mark defect and inferior pattern defect at an ordinary scan speed (e.g. 500 mm/s) and can effectively suppress the generation of these defects even at a high scan speed (e.g. 700 mm/s); and a method for formation of photoresist pattern.

The present inventors made a study in order to achieve the above aim. As a result, the followings were found. That is, the above aim can be achieved neither by the single use of the below-mentioned resin (A) or (B), nor by the use of a resin having both of a repeating unit represented by the general formula (1-1) and a repeating unit represented by the general formula (1-2), i.e. a copolymer having a repeating unit represented by the general formula (1-1) and a repeating unit represented by the general formula (1-2); however, the above aim can be achieved by a composition for formation of upper layer film, which comprises a resin (A) having a particular repeating unit but not having a particular repeating unit and a resin (B) having a particular repeating unit but not having a particular repeating unit. The finding has led to the completion of the present invention.

According to the present invention, there are provided the following composition for formation of upper layer film and the following method for formation of photoresist pattern.

[1] A composition for formation of upper layer film, which is used for forming an upper layer film on the surface of a photoresist film and which comprises
a resin (A) having a repeating unit represented by the following general formula (1-1) and not having a repeating unit represented by the following general formula (1-2), and
a resin (B) having a repeating unit represented by the following general formula (1-2) and not having a repeating unit represented by the following general formula (1-1).

[Formula 1]

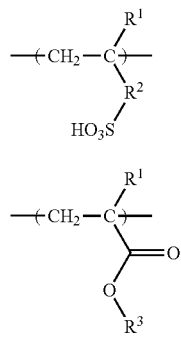

[In the above general formulas (1-1) and (1-2), $R^1$ is hydrogen, a methyl group or a trifluoromethyl group; $R^2$ is single bonds, methylene, a linear or branched alkylene group having 2 to 6 carbon atoms, or a group represented by general formula $C(O)XR^4$ wherein X is oxygen, sulfur or an NH group and $R^4$ is methylene, or a linear or branched alkylene group having 2 to 6 carbon atoms; and $R^3$ is a linear or branched alkyl group of 1 to 12 carbon atoms, in which at least one hydrogen atom is substituted with fluorine atom, or an alkyl group of alicyclic structure, having 1 to 12 carbon atoms, in which at least one hydrogen atom is substituted with fluorine atom.]

[2] A composition for formation of upper layer film, according to [1], which, when coated on the surface of a photoresist film and the subjected to preliminary firing at 50 to 150° C. for 1 to 360 seconds to form an upper layer film, gives a receded contact angle θ of 700 or more to water as measured under the following condition (θ).

Condition (θ): A water droplet of 25 μl formed on an upper layer film is sucked at a rate of 10 μl/min.

[3] A composition for formation of upper layer film, according to [2], wherein the photoresist composition comprises an acid-dissociable group-containing resin (X) and an acid-generating agent (Y), the resin (X) has an acid-dissociable group-containing repeating unit, and this repeating unit is 30 to 60 mol % relative to the total repeating units of the resin (X).

[4] A composition for formation of upper layer film, according to [2], wherein either or both of the resin (A) and the resin (B) have each independently at least one kind of repeating unit selected from the group consisting of the following general formulas (2-1), (2-2) and (2-3).

[Formula 2]

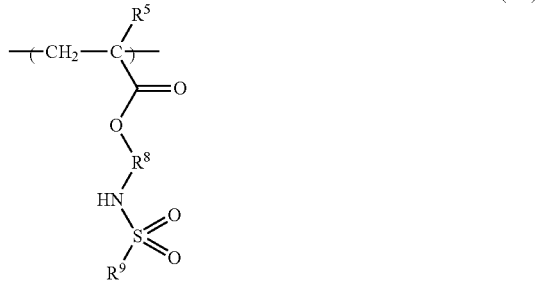

[In the general formulas (2-1), (2-2) and (2-3), $R^5$ is hydrogen, a methyl group or a trifluoromethyl group; $R^6$, $R^7$ and $R^8$ are each independently single bonds, methylene, a linear or branched alkylene group having 2 to 6 carbon atoms, or an alicyclic alkylene group having 4 to 12 carbon atoms; and $R^9$ is a linear or branched alkyl group of 1 to 10 carbon atoms, in which at least one hydrogen atom is substituted with fluorine atom, or an alicyclic alkyl group having 3 to 10 carbon atoms.]

[5] A composition for formation of upper layer film, according to [2], wherein the mass ratio of the resin (A) and the resin (B), i.e. [resin (A)/resin (B)] is 0.3 or more.

[6] A method for formation of photoresist pattern, which comprises:
a step of coating a photoresist composition on a substrate to form a photoresist film,
a step of coating, on the photoresist film, a composition for formation of upper layer film set forth in any of claims 1 to 5, to form an upper layer film, and a step of placing a liquid immersion medium between the upper layer film and a lens, applying an exposure ray to the photoresist film and the upper layer film via the liquid immersion medium and a mask having a pattern, then conducting development to obtain a resist pattern.

The composition for formation of upper layer film, according to the present invention can advantageously form an upper layer film which has sufficient transmission for exposure ray, which can be formed on a photoresist film while causing substantially no intermixing with the photoresist film, which, in liquid immersion exposure, is highly insoluble in a liquid medium (e.g. water) and can maintain a stable film state, and which has a sufficiently high receded contact angle and enables formation of a resist pattern of high resolution. With such a composition for formation of upper layer film, the generation of defects such as water mark defect and the like can be suppressed effectively even at a high scan speed (e.g. 700 mm/s).

The method for formation of photoresist pattern, according to the present invention comprises:

a step of coating a photoresist composition on a substrate to form a photoresist film, a step of coating, on the photoresist film, the composition for formation of upper layer film, of the present invention to form an upper layer film, and a step of placing a liquid immersion medium between the upper layer film and a lens, applying an exposure ray to the photoresist film and the upper layer film via the liquid immersion medium and a mask having a particular pattern, then conducting development to obtain a resist pattern. Therefore, the present method can form a photoresist pattern which is effectively suppressed in defects such as water mark defect and the like, even at a high scan speed (e.g. 700 mm/s).

EXPLANATION OF SYMBOLS

Figure 1:
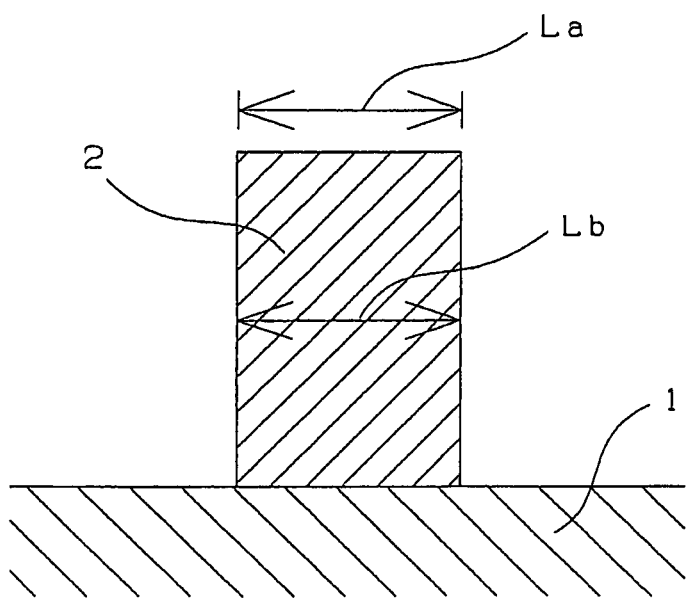
FIG. 1 is a sectional view schematically showing the shape of line and space pattern.

1 is a substrate; 2 is a pattern; 3 is an 8-inch silicon wafer; 4 is a hexamethyldisilazane-treated layer; 5 is a silicon rubber sheet; 6 is a hollow portion; 7 is ultra-pure water; 8 is a lower layer anti-reflection film; 9 is an upper layer film; 10 is an 8-inch silicon wafer; 11 is a resist film; La is a line width at film top; and Lb is a line width at middle of film.

BEST EMBODIMENT FOR CARRYING OUT THE INVENTION

The best embodiment for carrying out the present invention is described below. However, the present invention is not restricted to the following embodiment and it should be construed that the following embodiment can be subjected to appropriate changes, improvements, etc. based on the knowledge possessed by those skilled in the art as long as there is no deviation from the gist of the present invention and that the resulting embodiments as well fall in the scope of the present invention.

[1] Composition for Formation of Upper Layer Film

An embodiment of the composition for formation of upper layer film, of the present invention is a composition for formation of upper layer film, which is used for forming an upper layer film on the surface of a photoresist film and which comprises a resin (A) having a repeating unit represented by the following general formula (1-1) and not having a repeating unit represented by the following general formula (1-2), and a resin (B) having a repeating unit represented by the following general formula (1-2) and not having a repeating unit represented by the following general formula (1-1).

[Formula 3]

(1-1)

(1-2)

[In the above general formulas (1-1) and (1-2), $R^1$ is hydrogen, a methyl group or a trifluoromethyl group; $R^2$ is single bonds, methylene, a linear or branched alkylene group having 2 to 6 carbon atoms, or a group represented by general formula $C(O)XR^4$ wherein X is oxygen, sulfur or an NH group and $R^4$ is methylene, or a linear or branched alkylene group having 2 to 6 carbon atoms; and $R^3$ is a linear or branched alkyl group of 1 to 12 carbon atoms, in which at least one hydrogen atom is substituted with fluorine atom, or an alkyl group of alicyclic structure, having 1 to 12 carbon atoms, in which at least one hydrogen atom is substituted with fluorine atom.]

The upper layer film formed by the above composition for formation of upper layer film has advantageously sufficient transmission for exposure ray; can be formed on a photoresist film while causing substantially no intermixing with the photoresist film; in liquid immersion exposure, is highly insoluble in a liquid medium (e.g. water) and can maintain a stable film state; and has a sufficiently high receded contact angle and enables formation of a resist pattern of high resolution.

When the composition for formation of upper layer film, of the present embodiment is coated on the surface of a photoresist film and then subjected to preliminary baking at 50 to 150° C. for 1 t 360 seconds to form an upper layer film, the upper layer film has a receded contact angle θ to water, of preferably 70° or more, more preferably 70 to 85°, particularly preferably 70 to 76° as measured under the following condition (θ). With a receded contact angle θ of less than 70°, liquid droplets tend to remain on the upper layer film when the scan speed in liquid-filled exposure is high, which may generate defects such as water mark defect and the like.

Condition (θ): A water droplet of 25 μl formed on an upper layer film is sucked at a rate of 10 μl/min.

Since the upper layer film formed with such a composition for formation of upper layer film has a sufficiently high receded contact angle, liquid droplets hardly remain on the upper layer film even when the scan speed in liquid immersion exposure is high, that is, liquid immersion exposure is conducted while an exposure ray is moved on the upper layer film at a high speed, whereby the generation of defects such as water mark defect and the like can be suppressed more effectively.

The composition for formation of upper layer film, of the present embodiment is used in order to form an upper layer film on the surface of a photoresist film. As to the kind of the photoresist film on which an upper layer film can be formed by the composition for formation of upper layer film, of the present embodiment, there is no particular restriction. However, the photoresist film is preferred to be formed by a photoresist composition which comprises an acid-dissociable group-containing resin (X) and an acid-generating agent (Y), wherein the resin (X) has an acid-dissociable group-containing repeating unit and the content of the acid-dissociable group-containing repeating unit is 30 to 60 mol % relative to the total repeating units of the resin (X). When the content of the acid-dissociable group-containing repeating unit is less than 30 mol %, the resolution of the photoresist film formed may be inferior. Meanwhile, when the content of the above repeating unit is more than 60%, the film thickness of the photoresist film after peeling of the upper layer film may become extremely thin.

As examples of the resin (X), there can be mentioned a resin having the following repeating unit (M-1), the following repeating unit (M-2) and the following repeating unit (M-3), a resin having the following repeating unit (M-1), the following repeating unit (M-2) and the following repeating unit (M-4), and a resin having the following repeating unit (M-1), the following repeating unit (M-3) and the following repeating unit (M-5).

[Formula 4]

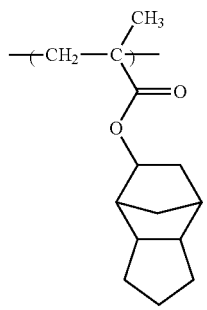

(M-1)

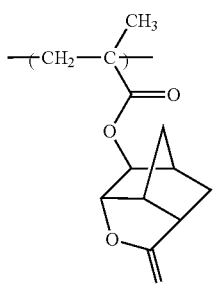

(M-2)

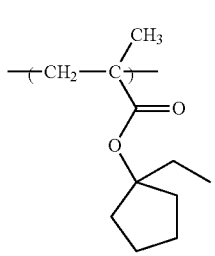

(M-3)

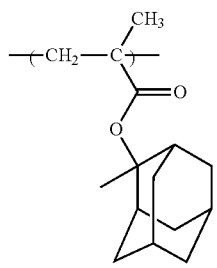

(M-4)

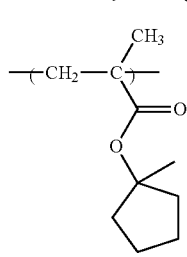

(M-5)

The acid-generating agent (Y) generates an acid when irradiated with (exposed to) a radiation; this acid dissociates the acid-dissociable group which protects the acidic group (e.g. carboxyl group) of the resin; as a result, the acidic group is exposed.

As examples of the acid-generating agent (Y), there can be mentioned triphenylsulfonium.nonafluoro-n-butanesulfonate, 4-cyclohexylphenyl.diphenylsulfonium-nonafluoro-n-butanesulfonate, 1-(4-n-butoxynaphthalen-1-yl) tetrahydrothiophenium.nonafluoro-n-butanesulfonate, triphenylsulfonium 2-(bicyclo[2.2.1]hept-2'-yl)-1,1,2,2-tetrafluoroethanesulfonate, 1-(4-n-butoxynaphthyl)tetrahydrothiophenium 2-(bicyclo[2.2.1]hept-2'-yl)-1,1,2,2-tetrafluoroethanesulfonate, and triphenylsulfonium 2-(bicyclo [2.2.1]hept-2'-yl)-1,1-difluoroethanesulfonate.

As an specific example of the method for forming the upper layer film on the surface of a photoresist film, there can be mentioned a method of preparing a composition for formation of upper layer film, of the present embodiment in which the total solid content has been adjusted to 0.2 to 20 mass % with a solvent, filtering the composition through a filter having a pore diameter of about 30 nm, and coating the filtered composition on the surface of a photoresist film by a known method such as spin coating, cast coating, roll coating or the like. Incidentally, after the coating of the composition on the surface of the photoresist film, preliminary baking (hereinafter referred to as "PB" in some cases) may be conducted in order to evaporate the solvent.

[1-1] Resin (A)

The resin (A) contained in the composition for formation of upper layer film, of the present embodiment has a repeating unit represented by the general formula (1-1) and does not have a repeating unit represented by the general formula (1-2). Since the resin (A) has a sulfonic group, the dependency of resist shape can be advantageously reduced.

In the general formula (1-1), $R^2$ is single bonds, methylene, a linear or branched alkylene group having 2 to 6 carbon atoms, or a group represented by the general formula C(O)XR$^4$ wherein X is oxygen, sulfur or an NH group and $R^4$ is methylene or a linear or branched alkylene group having 2 to 6 carbon atoms.

As the linear or branched alkylene group having 2 to 6 carbon atoms, of $R^2$ and $R^4$, there can be mentioned, for example, ethylene group, propylene group (e.g. 1,3-propylene group or 1,2-propylene group), tetramethylene group, pentamethylene group and hexamethylene group.

As preferred examples of the monomer used for obtaining the repeating unit represented by the general formula (1-1), there can be mentioned vinylsulfonic acid, allylsulfonic acid, 2-(meth)acrylamide-2-methyl-1-propanesulfonic acid and 4-vinyl-1-benzenesulfonic acid.

In the general formula (1-2), $R^3$ is a linear or branched alkyl group of 1 to 12 carbon atoms, in which at least one hydrogen atom is substituted with fluorine atom, or an alkyl group of alicyclic structure, having 1 to 12 carbon atoms, in which at least one hydrogen atom is substituted with fluorine atom. As these alkyl groups, there can be mentioned, for example, saturated chain hydrocarbon groups such as methylene group, ethylene group, propylene group (e.g. 1,3-propyelne group or 1,2-propylene group), tetramethylene group, pentamethylene group, hexamethyene group, heptamethylene group, octamethylene group, nonamethylene group, decamethylene group, undecamethylene group, dodecamethylene group, tridecamethylene group, tetradecamethylene group, pentadecamethylene group, hexadcamethylene group, heptadecamethylene group, octadecamethylene group, nonadecamethylene group, 1-methyl-1,3-propylene group, 2-methyl 1,3-propylene group, 2-methyl-1,2-propylene group, 1-methyl-1,4-butylene group, 2-methyl-1,4-butylene group, methylidene group, ethylidene group, propylidene group, 2-propylidene group and the like; monocyclic hydrocarbon ring groups, for example, cycloalkylene groups having 3 to 10 carbon atoms, such as cyclobutylene group (e.g. 1,3-cyclobutylene group), cyclopentylene group (e.g. 1,3-cyclopentylene group), cyclohexylene group (e.g. 1,4-cyclohexylene group), cyclooctylene group (e.g. 1,5-cyclooctylene group) and the like; norbornylene groups such as 1,4-norbornylene group, 2,5-norbornylene group and the like; and partially fluorinated perfluoroalkyl groups in which at least one hydrogen atom of a linear or branched alkyl group, for example, an adamantylene group (e.g. 1,5-adamantylene group or 2,6-adamantylene group) is substituted with fluorine atom.

As preferred examples of the monomer used for obtaining the repeating unit represented by the general formula (1-2), there can be mentioned trifluoromethyl (meth)acrylate, 2,2,2-trifluoroethyl(met)acrylate, perfluoroethyl(meth)acrylate, perfluoro n-propyl(meth)acrylate, perfluoroisopropyl(meth)acrylate, perfluoro n-butyl(meth)acrylate, perfluoroisobutyl (meth)acrylate, perfluoro tert-butyl(meth)acrylate, 2-(1,1,1,3,3,3-hexafluoropropyl)(meth)acrylate, 1-(2,2,3,3,4,4,5,5-octafluoropentyl)(meth)acrylate, perfuorocyclohexyl methyl (meth)acrylate, 1-(2,2,3,3,3-pentafluoropropyl)(meth) acrylate, 1-(3,3,4,4,5,5,6,6,7,7,8,8,9,9,10,10,10-heptadecafluorodecyl)(meth)acrylate, and 1-(5-trifluoromethyl-3,3,4,4,5,6,6,6-octafluorohexyl)(meth) acrylate.

The proportion of the repeating unit represented by the general formula (1-1) is preferably 1 to 20 mol %, more preferably 1 to 15 mol % relative to the total repeating units of the resin (A). When the proportion is less than 1 mol %, the shape of resist may become T-top. Meanwhile, when the proportion is more than 20 mol %, the amount of thinning of resist film is large and the property of resist film may be deteriorated.

[1-2] Resin (B)

The resin (B) contained in the composition for formation of upper layer film, of the present embodiment has a repeating unit represented by the general formula (1-2) and does not have a repeating unit represented by the general formula (1-1). The repeating unit represented by the general formula (1-1) and the repeating unit represented by the general formula (1-2) are the same as the repeating unit represented by the general formula (1-1) and the repeating unit represented by the general formula (1-2) both explained with respect to the resin (A). Since the resin (B) has a fluoroalkyl group, the upper layer film formed with the composition for formation of upper layer film, of the present embodiment can advantageously keep a high receded contact angle.

The proportion of the repeating unit represented by the general formula (1-2) is preferably 5 to 60 mol %, more preferably 5 to 50 mol %, particularly preferably 5 to 30 mol % relative to the total repeating units of the resin (B). When the proportion is less than 5 mol %, it is impossible to obtain a high receded contact angle, which may make it impossible to respond to the scanning of high speed. Meanwhile, when the proportion is more than 60 mol %, the solubility of the resin (B) in developing solution is low, which may generate various defects.

Preferably, either or both of the resin (A) and the resin (B) contained in the composition for formation of upper layer film, of the present embodiment have each independently at least one kind of repeating unit selected from the group consisting of the following general formulas (2-1), (2-2) and (2-3). By containing such repeating unit(s), the resin (A) and/or the resin (B) has an alkali-soluble group and, thereby, the upper layer film formed by the composition for formation of upper layer film, of the present embodiment advantageously has extremely good solubility in developing solution.

[Formula 5]

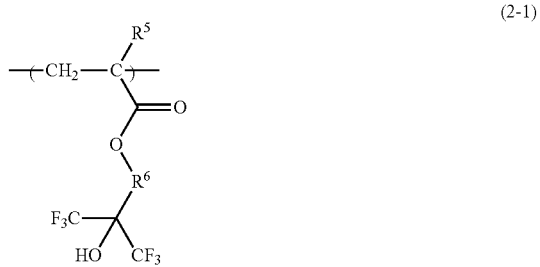

(2-1)

(2-2)

-continued

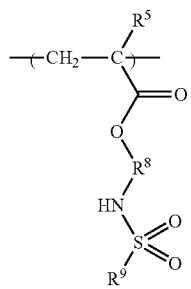

(2-3)

[In the general formulas (2-1), (2-2) and (2-3), $R^5$ is hydrogen, a methyl group or a trifluoromethyl group; $R^6$, $R^7$ and $R^8$ are each independently single bonds, methylene, a linear or branched-alkylene group having 2 to 6 carbon atoms, or an alicyclic alkylene group having 4 to 12 carbon atoms; and $R^9$ is a linear or branched alkyl group of 1 to 10 carbon atoms, in which at least one hydrogen atom is substituted with fluorine atom, or an alicyclic alkyl group having 3 to carbon atoms.]

In the general formulas (2-1) and (2-3), $R^6$ and $R^8$ are each single bonds, methylene, a linear or branched alkylene group having 2 to 6 carbon atoms, or an alicyclic alkylene group having 4 to 12 carbon atoms. As the linear or branched alkylene group having 2 to 6 carbon atoms or the alicyclic alkylene group having 4 to 12 carbon atoms, there can be mentioned, for example, saturated chain hydrocarbon groups such as methylene group, ethylene group, propylene group (e.g. 1,3-propyelne group or 1,2-propylene group), tetramethylene group, pentamethylene group, hexamethyene group, heptamethylene group, octamethylene group, nonamethylene group, decamethylene group, undecamethylene group, dodecamethylene group, tridecamethylene group, tetradecamethylene group, pentadecamethylene group, hexadcamethylene group, heptadecamethylene group, octadecamethylene group, nonadecamethylene group, 1-methyl-1,3-propylene group, 2-methyl 1,3-propylene group, 2-methyl-1,2-propylene group, 1-methyl-1,4-butylene group, 2-methyl-1,4-butylene group, methylidene group, ethylidene group, propylidene group, 2-propylidene group and the like; monocyclic hydrocarbon ring groups, for example, cycloalkylene groups having 3 to 10 carbon atoms, such as cyclobutylene group (e.g. 1,3-cyclobutylene group), cyclopentylene group (e.g. 1,3-cyclopentylene group), cyclohexylene group (e.g. 1,4-cyclohexylene group), cyclooctylene group (e.g. 1,5-cyclooctylene group) and the like; and crosslinked cyclic hydrocarbon ring groups, for example, bi- to tetra-cyclic hydrocarbon ring groups having 4 to 30 carbon atoms, such as norbornylene group (e.g. 1,4-norbornylene group or 2,5-norobornylene group), adamantylene group (e.g. 1,5-adamantylene group or 2,6-adamantylene group) and the like. Incidentally, of the above-mentioned examples of the linear or branched alkylene group having 2 to 6 carbon atoms or the alicyclic alkylene group having 4 to 12 carbon atoms, of $R^5$ and $R^8$, there are preferred hydrocarbon groups containing 2,5-norbornylene group, 1,2-ethylene group and propylene group.

When $R^6$ and $R^8$ contain a bi-valent alicyclic hydrocarbon group, it is preferred that an alkylene group of 1 to 4 carbon atoms is present as a spacer between the bistrifluoromethyl-hydroxy-methyl group (—$CF_3$—C(OH)—$CF_3$ group) and the above-mentioned bi-valent alicyclic hydrocarbon group.

As the monomer used for obtaining the repeating unit represented by the general formula (2-1) or (2-3), there can be mentioned, for example, (1,1,1-trifluoro-2-trifluoromethyl-2-hydroxy-3-propyl)(meth)acrylate, (1,1,1-trifluoro-2-trifluoromethyl-2-hydroxy-4-butyl)(meth)acrylate, (1,1,1-trifluro-2-trifluoromethyl-2-hydroxy-5-pentyl)(meth)acrylate, (1,1,1-trifluro-2-trifluoromethyl-2-hydroxy-4-pentyl) (meth)acrylate, 2-{[5-(1',1',1'-trifluoro-2'-trifluoromethyl-2'-hydroxy)propyl]bicyclo[2.2.1]heptyl}(meth)acrylate, and 3-{[8-(1',1',1'-trifluoro-2'-trifluoromethyl-2'-hydroxy)propyl]tetracyclo[6.2.1.1$^{3.6}$.0$^{2,7}$]dodecyl}(meth)acrylate.

When $R^7$ of the general formula (2-2) is expressed "-A-B-", there can be mentioned, as specific examples of "A", single bond, carbonyl group, carbonyloxy group and oxycarbonyl group. As specific examples of "B", there can be mentioned single bond, methylene group and alkylene group having 2 to 12 carbon atoms.

As the alkylene group having 2 to 20 carbon atoms which is a specific example of "B", there can be mentioned, for example, saturated chain hydrocarbon groups such as methylene group, ethylene group, propylene group (e.g. 1,3-propyelne group or 1,2-propylene group), tetramethylene group, pentamethylene group, hexamethyene group, heptamethylene group, octamethylene group, nonamethylene group, decamethylene group, undecamethylene group, dodecamethylene group, tridecamethylene group, tetradecamethylene group, pentadecamethylene group, hexadecamethylene group, heptadecamethylene group, octadecamethylene group, nonadecamethylene group, icosalene group, 1-methyl-1,3-propylene group, 2-methyl-1,3-propylene group, 2-methyl-1,2-propylene group, 1-methyl-1,4-butylene group, 2-methyl-1,4-butylene group, methylidene group, ethylidene group, propylidene group, 2-propylidene group and the like; arylene group such as phenylene group or tolylene group; monocyclic hydrocarbon ring groups, for example, cycloalkylene groups having 3 to 10 carbon atoms, such as cyclobutylene group (e.g. 1,3-cyclobutylene group), cyclopentylene group (e.g. 1,3-cyclopentylene group), cyclohexylene group (e.g. 1,4-cyclohexylene group), cyclooctylene group (e.g. 1,5-cyclooctylene group) and the like; norbornylene groups such as 1,4-norbornylene group, 2,5-norobornylene group and the like; and adamantylene groups such as 1,5-adamantylene group, 2,6-adamantylene group and the like.

As the monomer used for obtaining the repeating unit represented by the general formula (2-2), there can be mentioned, for example, (meth)acrylic acid, bicyclo[2.2.1]hept-5-en-2-ylmethanecarboxylic acid, 2-bicyclo[2.2.1]hept-5-enecarboxylic acid, 4-tricyclo[5.2.1.0$^{2,6}$]dec-8-enecarboxylic acid, tricyclo[5.2.1.0$^{2,6}$]dec-8-en-4-ylmethanecarboxylic acid, and bicyclo[2.2.1]hep-5-en-2-ylmethanecarboxylic acid.

In the general formula (2-3), $R^9$ is a linear or branched alkyl group of 1 to 10 carbon atoms, in which at least one hydrogen atom is substituted with fluorine atom, or an alicyclic alkyl group of 3 to 10 carbon atoms. As these alkyl groups, there can be mentioned, for example, monofluoromethyl group, difluoromethyl group, trifluoromethyl group, 2,2,2-trifluoroethyl group and perfluoroethyl group. Of these groups, trifluoromethyl group, etc. are preferred.

As the monomer used for obtaining the repeating unit represented by the general formula (2-3), there can be mentioned, for example, (((trifluoromethyl)sulfonyl)amino)

ethyl-1-methacrylate, 2-(((trifluoromethyl)sulfonyl)amino)ethyl-1-acryate, and the compounds represented by the following formulas.

[Formula 6]

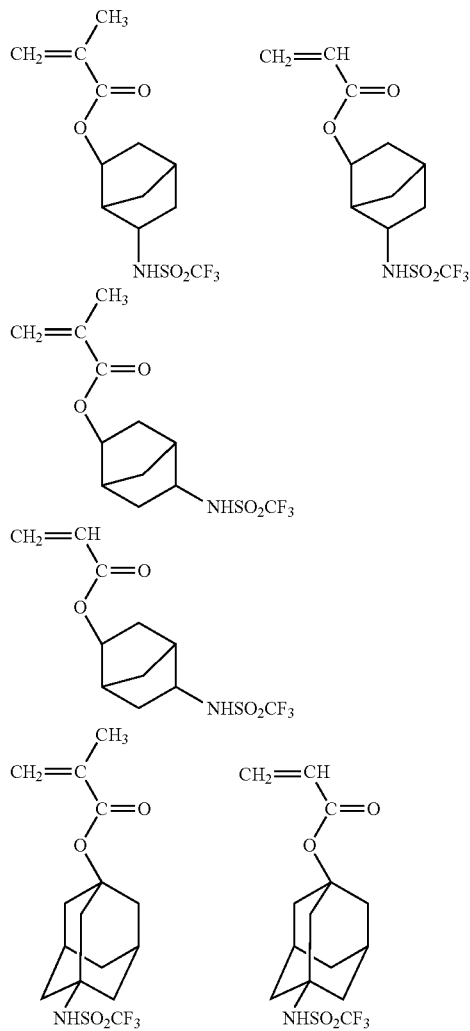

When the resin (A) has at least one kind of repeating unit selected from the group consisting of the general formulas (2-1), (2-2) and (2-3), the proportion of the total amount of these repeating units is preferably 50 to 99 mol %, more preferably 80 to 95 mol % relative to the total repeating units of the resin (A). When the proportion is less than 50 mol %, it may be impossible to keep a sufficiently high receded contact angle. Meanwhile, when the proportion is more than 99 mol %, the shape of resist may be inferior.

When the resin (B) has at least one kind of repeating unit selected from the group consisting of the general formulas (2-1), (2-2) and (2-3), the proportion of the total amount of these repeating units is preferably 30 to 90 mol %, more preferably 40 to 80 mol % relative to the total repeating units of the resin (B). When the proportion is less than 30 mol %, the solubility of the resin (B) in alkali may be extremely low and the shape of resist may be inferior. Meanwhile, when the proportion is more than 90 mol %, it may be impossible to keep a sufficiently high receded contact angle.

The resin (A) and the resin (B) both contained in the composition for formation of upper layer film, of the present embodiment may contain a repeating unit derived from other radically-polymerizable monomer (hereinafter, this repeating unit is described as "other repeating unit" in some cases) to control molecular wait, glass transition point, and solubility to a solvent of the resin and a structural unit derived from an acid-dissociable group-containing monomer.

As the monomer used for obtaining the other repeating unit, there can be mentioned, for example, alkyl(meth)acrylates such as methyl (meth)acrylate, ethyl(meth)acrylate, n-butyl(meth)acrylate, sec-butyl(meth)acrylate, tert-butyl (meth)acrylate, isopropyl(meth)acrylate, n-hexyl(meth)acrylate, cyclohexyl(meth)acrylate, 2-methylcyclohexyl(meth)acrylate, dicyclopentanyloxyethyl(meth)acrylate, isobornyl (meth)acrylate, dicyclopentanyl(meth)acrylate, methoxydipropylene glycol(meth)acrylate, butoxy-dipropylene glycol(meth)acrylate, methoxydiethylene glycol(meth)acrylate, methoxypropylene glycol(meth)acrylate, 2-methyl-2-adamantyl(meth)acrylate, 2-ethyl-2-adamantyl(meth(acrylate, 2-propyl-2-adamantyl(meth)acrylate, 2-butyl-2-adamantyl(meth)acrylate, 1-methyl-1-cyclohexyl(meth)acrylate, 1-ethyl-1-cyclohexyl(meth)acrylate, 1-propyl-1-cyclohexyl(meth)acrylate, 1-butyl-1-cyclohexyl(meth)acrylate, 1-methyl-1-cyclopentyl(meth)acrylate, 1-ethyl-1-cyclopentyl(meth)acrylate, 1-propyl-1-cyclopentyl(meth)acrylate, 1-butyl-1-cyclopentyl(meth)acrylate, 1-adamantyl-1-methylethyl(meth)acrylate, 1-bicyclo[2.2.1]heptyl-1-methylethyl(meth)acrylate, and the like;

dicarboxylic acid diesters such as diethyl maleate, diethyl fumarate, diethyl itaconate and the like; aryl (meth)acrylates such as phenyl (meth)acrylate, benzyl (meth)acrylate and the like; aromatic vinyls such as styrene, α-methylstyrene, m-methylstyrene, p-methylstyrene, vinyltoluene, p-methoxystyrene and the like; nitrile group-containing radically polymerizable monomers such as acrylonitrile, methacrylonitrile and the like; amide bond-containing radically polymerizable monomers such as acrylamide, methacrylamide and the like; fatty acid vinyls such as vinyl acetate and the like; chlorine-containing radically polymerizable monomers such as vinyl chloride, vinylidene chloride and the like; and conjugated dienes such as 1,3-butadiene, isoprene, 1,4-dimethylbutadiene and the like. Of these, preferred are alkyl (meth)acrylates, nitrile group-containing radically polymerizable monomers, amide bond-containing radically polymerizable monomers, and hydroxy group-containing alkyl(meth)acrylates. These monomers can be used singly or in combination of two or more kinds.

The proportion of the other repeating unit is preferably 50 mol % or less, more preferably 40 mol % or less relative to the total repeating units of the resin (A) or (B) containing the other repeating unit. When the proportion is more than 50 mol %, the solubility in aqueous alkali solution (developing solution) is low, making difficult the removal of upper layer film, and a residue may remain on the resist after development.

There is no particular restriction as to the method for producing the resin (A) or (B). As to the resin (A), there can be mentioned, for example, a method of subjecting, to radical polymerization in the presence of an appropriate initiator and an appropriate chain transfer agent in a polymerization solvent, at least one corresponding radically polymerizable monomer; that is, a monomer used for obtaining a repeating unit represented by the general formula (1-1), and, as necessary, a monomer(s) used for obtaining at least one kind of repeating unit selected form the group consisting of the general formulas (2-1), (2-2) and (2-3) and a monomer used for obtaining other repeating unit (hereinafter, these monomers are referred to generically as "monomers used for production of resin (A)", in some cases). The resin (B) can be produced by the same production method as for the resin (A) except that a monomer used for obtaining the repeating unit represented by the general formula (1-2) is used in place of the monomer used for obtaining the repeating unit represented by the general formula (1-1).

As the initiator, there can be mentioned, for example, azo compounds such as 2,2'-azobis(4-methoxy-2,4-dimethylvaleronitrile, 2,2'-azobis(2,4-dimethylvaleronitrile), dimethyl 2,2'-azobis(2-methylpropionate), 2,2'-azobis(2-methylbutyronitrile), 1,1'-azobis(cyclohexane-1-carbonitrile), 2,2'-azobis[N-(2-propneyl)-2-methylpropionamide], 1.[(cyano-1-methylethyl)azo]formamide, 2,2'-azobis(N-butyl-2-methylpropionamide), 2,2'-azobis(N-cyclohexyl-2-methylpropionamide), 2,2'-azobisisobutyronitrile, 2,2'-azobisdimethylvaleronitrile and the like;

di-tert-butyl peroxide, tert-butyl hydroperoxide, benzoyl peroxide, lauroyl peroxide, potassium persulfate, tert-butyl peroxypivalate, tert-butyl hydroperoxide, and dicumyl peroxide. Of these, preferred are dimethyl 2,2'-azobis(2-methylpropionate) and 2,2'-azobisisbutyronitrile.

As the chain transfer agent, there can be mentioned, for example, halogen compounds such as carbon tetrachloride, carbon tetrabromide and the like; alcohols such as isopropyl alcohol, isobutyl alcohol and the like; olefins such as 2-methyl-1-butene, 2,4-diphenyl-4-methyl-1-pentene and the like; sulfur-containing compounds such as ethanethiol, butanethiol, dodecanethiol, mercaptoethanol, mercaptopropanol, methyl mercaptopropionate, ethyl mercaptopropionate, mercaptopropionic acid, thioglycolic acid, ethyl disulfide, sec-butyl disulfide, 2-hydroxyethyl disulfide, thiosalicylic acid, thiophenol, thiocresol, benzylmercaptan, phenethylmercaptan and the like; and α-methylstyrene dimer.

As the polymerization solvent used in producing the resin (A) or the resin (B), there can be mentioned, for example, alcohols such as methanol, ethanol, 1-propanol, 2-propanol, 1-butanol, 2-butanol, ethylene glycol, diethylene glycol, propylene glycol and the like; cyclic ethers such as tetrahydrofuran, dioxane and the like; polyhydric alcohol alkyl ethers such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether, propylene glycol monoethyl ether and the like; polyhydric alcohol alkyl ether acetates such as ethylene glycol ethyl ether acetate, diethylene glycol ethyl ether acetate, propylene glycol ethyl ether acetate, propylene glycol monomethyl ether acetate and the like;

aromatic hydrocarbons such as toluene, xylene and the like; ketones such as acetone, methyl ethyl ketone, methyl isobutyl ketone, cyclohexanone, 4-hydroxy-4-methyl-2-pentanone, diacetone alcohol and the like; and esters such as ethyl acetate, butyl acetate, methyl 2-hydroxypropionate, ethyl 2-hydroxy-2-methylpropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropinate, methyl 3-ethoxypropionate and the like. Of these, preferred are cyclic ethers, polyhydric alcohol alkyl ethers, polyhydric alcohol alkyl ether acetates, ketones, esters, etc.

As the method for radical polymerization, there can be mentioned, for example, a method of charging, into a reaction vessel, all of a monomer(s) used for production of the resin (A), an initiator, a chain transfer agent and a polymerization solvent and then initiating polymerization, and a method of charging, into a reaction vessel, at least one member selected from monomers used for production of the resin (A) and the resin (B), an initiator, a chain transfer agent and a polymerization solvent, then dropping other components, and conducting polymerization. The radical polymerization can be conducted under known polymerization conditions, and the polymerization reaction is preferably conducted, for example, at 50 to 100° C. for 2 to 10 hours.

The weight-average molecular weight (hereinafter described as "Mw" in some cases) of the resin (A) or the resin (B) is preferably 2,000 to 100,000, more preferably 2,500 to 50,000, particularly preferably 3,000 to 20,000. When the Mw of the resin (A) or the resin (B) is smaller than 2,000, the upper layer film obtained may be significantly low in water resistance and mechanical properties. Meanwhile, when the Mw is larger than 100,000, the upper layer film obtained may be significantly low in solubility in the solvent described later. The ratio (Mw/Mn) of Mw and number-average molecular weight (hereinafter described as "Mn" in some cases), of the resin (A) is preferably 1 to 5, more preferably 1 to 3. The ratio of Mw and Mn, of the resin (B) is preferably 1 to 5, more preferably 1 to 3. Incidentally, in the present Specification, the "weight-average molecular weight" and the "number-average molecular weight" are each a polystyrene-reduced value obtained by gel permeation chromatography (GPC).

In the polymerization reaction mixture obtained by the radical polymerization, impurities such as halogen, metal and the like are preferred to be minimum. By minimizing the impurities, the composition for upper layer formation, of the present embodiment has better coatability and the upper layer film formed therewith has higher uniform solubility in alkali developing solution. As the method for purifying the resin (A) or the resin (B), there can be mentioned, for example, chemical purification methods such as water washing, liquid-liquid extraction and the like; and combinations of such a chemical purification method and a physical purification method such as ultrafiltration, centrifugation or the like.

Since the composition for formation of upper layer film, of the present embodiment contains the resin (A) and the resin (B), the composition can form an upper layer film (a protective film) which is stable to a medium such as water or the like, i.e. a liquid immersion medium. Therefore, the composition can be preferably used in liquid immersion exposure. Further, the composition can form an upper layer film which is soluble in the developing solution used in forming a resist pattern. Here, "stable to a medium (a liquid immersion medium)" refers to that the change ratio of film thickness measured by the "stability evaluation test" explained below is 3% or less of initial film thickness.

[Stability Evaluation Test]

A composition for formation of upper layer film, obtained by dissolving the resin (A) and the resin (B) in a solvent described later, is spin-coated on an 8-inch silicon wafer, using a coater/developer (1) (trade name: CLEAN TRACK ACT 8, a product of Tokyo Electron), and subjected to preliminary baking (PB) at 90° C. for 60 seconds to form an upper layer film of 90 nm in film thickness. The film thickness of this upper layer film is measured using a light interference type film thickness tester (trade name: Lambda Ace VM-2010, a product of Dainippon Screen MFG.). Incidentally, this thickness is referred to as initial film thickness. Next, Onto the surface of the wafer on which the upper layer film has been formed, is discharged ultra-pure water for 60 seconds from the rinse nozzle of the coater/developer (1), after which the wafer is rotated at 4,000 rpm for 15 seconds for spin-drying. Then, the film thickness of the upper layer film is measured again using the light interference type film thickness tester and a change ratio of film thickness to initial film thickness is calculated. When the change ratio calculated is within 3%, it is evaluated as "stable to medium (liquid immersion medium)". "Soluble in developing solution" refers to that, when an aqueous alkali solution is used as a developing solution, there is no residue of upper layer film on the resist pattern and the upper layer film can be removed. Incidentally, the remaining of the residue is examined visually.

Thus, the resin (A) and the resin (B) contained in the composition for formation of upper layer film, of the present embodiment are hardly soluble in a medium (e.g. water) and moreover are alkali-soluble (soluble in an aqueous alkaline solution which is a developing solution).

The upper layer film formed by the composition for formation of upper layer film, of the present embodiment prevents the direct contact of photoresist film with medium (e.g. water) in liquid immersion exposure, hardly causes the deterioration of lithography property of photoresist film due to penetration of the medium, and can prevent the staining of lens of projection aligner by the components dissolved out from photoresist film.

The mass ratio of the resin (A) and the resin (B) contained in the composition for formation of upper layer film, of the present embodiment, i.e. resin (A)/resin (B) is preferably 0.3 or more, more preferably 0.3 to 15.0, particularly preferably 0.3 to 9.0. When the mass ratio is less than 0.3, the shape of resist may become T-top. When the mass ratio is more than 14.1, it is difficult to obtain a sufficiently high receded contact angle, possessing a risk of being unable to respond to a high scan speed.

[1-3] Solvent

In the composition for formation of upper layer film, of the present embodiment, it is preferred to use a solvent in order to dissolve the resin (A) and the resin (B). The solvent is preferably such that hardly incurs the deterioration of lithography property, for example, causing no intermixing with photoresist film in coating of the composition on the photoresist film.

As the solvent, there can be mentioned, for example, monohydric alcohol, polyhydric alcohol, polyhydric alcohol alkyl ether, polyhydric alcohol alkyl ether acetate, ether, cyclic ether, higher hydrocarbon, aromatic hydrocarbon, ketone, ester, and water.

As the monohydric alcohol, there can be mentioned, for example, monohydric alcohols having 4 to 10 carbon atoms, such as 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexnol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentnaol, 4-methyl-3-pentanol, cyclohexanol and the like.

As the polyhydric alcohol, there can be mentioned, for example, ethylene glycol and propylene glycol. As the polyhydric alcohol alkyl ether, there can be mentioned, for example, ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether and propylene glycol monoethyl ether. As the polyhydric alcohol alkyl ether acetate, there can be mentioned, for example, ethylene glycol ethyl ether acetate, diethylene glycol ethyl ether acetate, propylene glycol ethyl ether acetate and propylene glycol monomethyl ether acetate.

As the ether, there can be mentioned, for example, dipropyl ether, diisopropyl ether, butyl methyl ether, butyl ethyl ether, butyl propyl ether, dibutyl ether, diisobutyl ether, tert-butylmethyl ether, tert-butyl ethyl ether, tert-butyl propyl ether, di-tert-butyl ether, dipentyl ether, diisoamyl ether, cyclopentyl methyl ether, cyclohexyl methyl ether, cyclopentyl ethyl ether, cyclohexyl ethyl ether, cyclopentyl propyl ether, cyclopentyl-2-propyl ether, cyclohexyl propyl ether, cyclohexyl-2-propyl ether, cyclopentyl butyl ether, cyclopentyl-tert-butyl ether, cyclohexyl butyl ether and cyclohexyl-tert-butyl ether. As the cyclic ether, there can be mentioned, for example, tetrahydrofuran and dioxane.

As the higher hydrocarbon, there can be mentioned, for example, decane, dodecane and undecane. As the aromatic hydrocarbon, there can be mentioned, for example, benzene, toluene and xylene. As the ketone, there can be mentioned, for example, acetone, methyl ethyl ketone, methyl isobutyl ketone, cyclohexanone, 4-hydroxy-4-methyl-2-pentanone and diacetone alcohol. As the ether, there can be mentioned, for example, ethyl acetate, butyl acetate, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-3-methylbutanonate, methyl 3-methoxypropionate, ethyl 3-methoxypropionate, ethyl 3-ethoxypropionate and methyl 3-ethoxypropionate.

Of these, preferred are monohydric alcohols, ethers, cyclic ethers, polyhydric alcohol alkyl ethers, polyhydric alcohol alkyl ether acetates and higher hydrocarbons, and more preferred are alcohols having 4 to 10 carbon atoms and alkyl ethers having an alkyl chain of 4 to 10 carbon atoms. These can be used singly or in combination of two or more kinds.

[1-4] Additives

The composition for formation of upper layer film, of the present embodiment can further contain a surfactant, etc. in order to have higher coatability, higher foam-dissipating property, higher leveling property, etc.

As commercial products of the surfactant, there can be mentioned, for example, fluorine-containing surfactants such as BM-1000, BM-1100 (products of BM Chemie), Megafac F142D, Megafac F172, Megafac F173, and Megafac F183 (products of Dainippon Ink and Chemicals, Incorporated), Fluorad FC-135, Fluorad FC-170C, Fluorad FC-430 and Fluorad FC-431 (products of Sumitomo 3M), SURFLON S-112, SURFLON S-113, SURFLON S-131, SURFLON S-141 and SURFLON S-145 (products of Asahi Glass), SH-28 PA, SH-190, SH-193, SZ-6032 and SF-8428 (products of Toray Dow Corning Silicone), Emulgen A-60, 104P and 306P (products of Kao), and so forth. The use amount of the surfactant is preferably 5 parts by mass or less relative to 100 parts by mass of the total amount of the resin (A) and the resin (B).

[2] Method for Formation of Photoresist Pattern

Next, an embodiment of the method for formation of photoresist pattern, of the present invention is described. The method for formation of photoresist pattern, of the present embodiment comprises:

a step (step (1)) of coating a photoresist composition on a substrate to form a photoresist film, a step (step (2)) of coating, on the photoresist film, a composition for formation of upper layer film, of the present invention to form an upper layer film, and a step of (step (3)) of placing a liquid immersion medium between the upper layer film and a lens, irradiating the photoresist film and the upper layer film with an exposure ray via the liquid immersion medium and a mask having an intended pattern, then conducting development to obtain a resist pattern.

In the method for formation of photoresist pattern, of the present embodiment which comprises the above-mentioned steps, there can be formed an upper layer film which has sufficient transmission for the wavelength of exposure ray, particularly 248 nm (KrF) and 193 nm (ArF), which is formed on a photoresist film while causing substantially no intermixing with the photoresist film, which, in liquid immersion exposure, is highly insoluble in a liquid medium (e.g. water) and can maintain a stable film state, and which has a satisfactorily high receded contact angle and enables formation of a resist pattern of high resolution; and the generation of water mark defect and inferior pattern defect can be suppressed effectively at an ordinary scan speed (e.g. 500 mm/s) and the generation of these defects can be suppressed effectively even at a high scan speed (e.g. 700 mm/s).

(Step (1))

First, the step (1) is a step of coating a photoresist composition on a substrate to form a photoresist film. As the substrate, there is ordinarily used a silicon wafer, a silicon wafer covered with aluminum, or the like. In order to utilize the properties of the photoresist film in the maximum effect, it is a preferred embodiment to form, in advance, an organic or inorganic anti-reflection film on the surface of the substrate (see, for example, JP-B-1994-12452).

As to the kind of the photoresist composition used for formation of photoresist film, there is no particular restriction, and an appropriate composition can be selected depending upon the application purpose of the resist obtained, from conventional photoresist compositions used for formation of photoresist film. However, it is preferred to use an acid-generating agent-containing, chemical amplification type resist material (a photoresist composition), particularly a positive resist material. As the chemical amplification type positive type resist material, there can be mentioned, for example, a radiation-sensitive resin composition (a photoresist composition) containing, as essential components, an acid-dissociable group-modified, alkali-soluble resin and a radiation-sensitive, acid-generating agent. A resin composition having such a constitution forms a photoresist film and then can form a positive resist pattern as follows. First, the photoresist film is irradiated (that is, exposed) to a radiation, whereby an acid is generated from the acid-generating agent; owing to the action of the generated acid, an acid-dissociable group is dissociated from the acid-dissociable group-modified, alkali-soluble resin and an acidic group (e.g. carboxyl group) is exposed; and the exposed portion has a higher alkali solubility. Then, the exposed portion is dissolved and removed with a developing solution (e.g. an alkali developing solution), whereby a positive resist pattern can be formed.

As the acid-dissociable group-modified, alkali-soluble resin, there can be preferably used the resin (X) described with respect to the composition for formation of upper layer film, of the present invention. As the radiation-sensitive, acid-generating agent, there can be preferably used the acid-generating agent (Y) described with respect to the composition for formation of upper layer film, of the present invention. When there is used a photoresist composition containing the resin (X) and the acid-generating agent (Y), it is preferred that the resin (X) in the photoresist composition has an acid-dissociable group-containing repeating unit and the amount of the repeating unit is 30 to 60 mol % relative to the total repeating units of the resin (X).

As the method for forming the photoresist film, there can be mentioned, for example, a method of preparing a photoresist composition in which the total solid content is adjusted at 0.2 to 20 mass % with a solvent, filtering the photoresist composition through a filter having a pore diameter of about 30 nm, to prepare a coating fluid, and coating the coating fluid on a substrate according to conventional coating means such as spin coating, cast coating, roll coating or the like. After the coating on a substrate, preliminary baking (hereinafter referred to as "PB" in some cases) may be conducted for vaporization of the solvent. The coating fluid may be prepared as above, or may be a commercially available resist fluid.

(Step (2))

The step (2) is a step of coating, on the photoresist film, a composition for formation of upper layer film, of the present invention. In this step, baking is preferably conducted after the coating of the composition for formation of upper layer film. This formation of an upper layer film on the photoresist film can prevent the direct contact of the photoresist film with a liquid immersion medium; therefore, there can be effectively prevented the reduction in the lithography property of the photoresist film caused by the penetration of the liquid immersion medium into the photoresist film, and the staining the lens of a projection aligner caused by the components dissolved out into the liquid immersion medium from the photoresist film. As the method for formation of the upper layer film, there can be used the same method as mentioned above for formation of the photoresist film except that a composition for formation of upper layer film, of the present invention is used in place of the photoresist composition.

The thickness of the upper layer film is preferably as close as possible to odd multiples of $\lambda/4m$ ($\lambda$ is the wavelength of radiation and m is the refractive index of protective film), because the effect of reflection suppression at the upper interface of the photoresist film is larger.

(Step (3))

The step (3) is a step of placing a liquid immersion medium between the upper layer film and a lens, applying an exposure ray to the photoresist film and the upper layer film via the liquid immersion medium and a mask having an intended pattern, then conducting development to obtain a resist pattern.

As the liquid immersion medium, a liquid having a refractive index higher than that of air is used ordinarily. Specifically, water is preferable and pure water is more preferable. As necessary, the pH of the liquid immersion medium may be adjusted. In a state that the liquid immersion medium is interposed, that is, in a state that the liquid immersion medium is filled between the lens of projection aligner and the upper layer film, a radiation is applied from the projection aligner to irradiate the upper layer film and the photoresist film via the mask having an intended pattern.

The radiation which can be used in the exposure (liquid immersion exposure), can be appropriately selected depending upon the kinds of the photoresist film and the upper layer film. There can be used, for example, visible light; ultraviolet ray such as g line, i line or the like; far ultraviolet ray such as excimer laser or the like; X ray such as synchrotron radiation or the like; and radiations such as charged particle beam (e.g. electron beam) and the like. Of these, preferred are ArF excimer laser (wavelength: 193 nm) and KrF excimer laser (wavelength: 248 nm). The application conditions of exposure ray, for example, radiation dose can be appropriately determined depending upon the formulation of photoresist composition and/or composition for formation of upper layer film, the kind of additive, etc.

After the exposure, development is conducted, whereby a desired photoresist pattern can be obtained. In the present production method, the upper layer film is formed with the composition for formation of upper layer film, of the present invention; therefore, the upper layer film can be removed easily in the development with a developing solution or, when cleaning is conducted after the development, in the cleaning. Thus, removal of the upper layer film by a separate peeling step is unnecessary.

As the developing solution, here is preferably used an aqueous alkaline solution obtained by dissolving at least one alkaline compound selected from sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetraalkylammonium hydroxides (e.g. tetramethylammonium hydroxide and tetraethylammonium hydroxide), pyrrole, piperidine, choline, 1,8-diazabicyclo-[5.4.0]-7-undecene, 1,5-diazabicyclo-[4.3.0]-5-nonane, etc. Of these, preferred is an aqueous solution of a tetraalkylammonium hydroxide.

To the developing solution may be added appropriate amounts of, for example, an water-soluble organic solvent (e.g. alcohol such as methanol or ethanol) and a surfactant. Incidentally, when development is conducted used an aqueous alkaline solution, it is preferred to conduct water washing after the development, and drying may be conducted after the water washing.

Post the exposure but before the development, it is preferred to conduct baking (PEB) in order to improve the resolution of photoresist film, the shape of pattern, the developability, etc. The temperature of baking can be appropriately set depending upon, for example, the kind of the photoresist composition and/or the composition for formation of upper layer film, but it is preferably 30 to 200° C., more preferably 50 to 150° C.

EXAMPLES

The present invention is described specifically below using Examples. However, the present invention is in no way restricted to these Examples. Incidentally, in Examples and Comparative Examples, "parts" and "%" are based on mass unless otherwise specified.

As the above-mentioned resin (A) and resin (B), there were respectively synthesized, according to the following methods, a resin (A-1) and resins (B-1) and (B-2), all capable of forming a film stable to water during the application of radiation and soluble in the developing solution used after the formation of resist pattern. A resin (A-2) was also synthesized for comparison with the resin (A-1) and the resins (B-1) and (B-2). Incidentally, the Mw and Mn of each of the resins (A-1), (B-1) and (B-2) obtained by Synthesis Example were measured by the following method.

[Method for Measurement of Molecular Weight (Mw, Mn)]

Measured by a gel permeation chromatography (GPC) using a monodisperse polystyrene as a standard, using GPC columns produced by Tosoh Corporation ("G2000H$_{XL}$" (trade name): 2, "G3000H$_{XL}$" (trade name): 1, "G4000H$_{XL}$" (trade name): 1) in a high-speed GPC apparatus produced by Tosoh Corporation (Model HLC-8102), under the analytical conditions of flow rate=1.0 ml/min, elutant=tetrahydrofuran, and column temperature=40° C.

Synthesis Example 1

First, in 100 g of isopropanol were dissolved 46.95 g (85 mol %) of 1,1,1-trifluoro-2-trifluoromethyl-2-hydroxy-4-pentyl methacrylate as a monomer for production a repeating unit represented by the general formula (2-1) and 6.91 g of 2,2'-azobis-(methyl 2-methylpropionate) as an initiator, to prepare a monomer solution. Separately, 50 g of isopropanol was placed in a 500-ml three-necked flask provided with a thermometer and a dropping funnel, followed by purging with nitrogen for 30 minutes. After the purging with nitrogen, the flask inside was heated to 80° C. with stirring with a magnetic stirrer. Using the dropping funnel, the above-prepared monomer solution was dropped into the flask in 2 hours. After the completion of the dropping, a reaction was allowed to take place for 1 hour; then, 10 g of an isopropanol solution containing 3.0 g (15 mol %) of vinylsulfonic acid as a monomer for production of a repeating unit represented by the general formula (1-1) was dropped in 30 minutes; thereafter, a reaction was allowed to take place for 1 hour. The flask inside was cooled to 30° C. or lower to obtain a copolymer solution.

The above obtained copolymer solution was concentrated to 150 g, and the concentrate was transferred to a separatory funnel. In the separatory funnel were placed 50 g of methanol and 600 g of n-hexane. Separation and purification was conducted. After the separation, the lower layer fluid was recovered. The lower layer fluid recovered was diluted with isopropanol to make the total volume 100 g. The solution was transferred to the separatory funnel. Therein were placed 50 g of methanol and 600 g of n-hexane, and separation and purification was conducted. After the separation, the lower layer fluid was recovered. The lower layer fluid recovered was substituted with 4-methyl-2-pentanol to make the total volume 250 g. Thereto was added 250 g of water, and separation and purification was conducted. After the separation, the upper layer fluid was recovered. The upper layer fluid recovered was substituted with 4-methyl-2-pentanol to obtain a resin solution. The resin solution was determined for solid concentration by weighing 0.3 g of the resin solution on an aluminum pan, heating it on a hot plate at 140° C. for 1 hour, weighing the mass of the residue after the heating, and calculating the solid concentration of the resin solution from the mass of the resin solution before heating and the mass of the residue (after heating). This solid concentration was used for preparation of a (to-be-described-later) composition for formation of upper layer film and for calculation of yield.

The copolymer contained in the resin solution showed an Mw of 9,760, an Mw/Mn of 1.51 and a yield of 65%. In the copolymer, the contents of the repeating unit derived from 1,1,1-trifluoro-2-trifluoromethyl-2-hydroxy-4-pentyl methacrylate and the repeating unit derived from vinylsulfonic acid were 95:5 (mol %). This copolymer was named as resin (A-1).

Synthesis Example 2

First, in 50 g of methyl ethyl ketone were dissolved 50 g of 1,1,1-trifluoro-2-trifluoromethyl-2-hydroxy-4-pentyl methacrylate and 1.95 g of 2,2-azobis-(methyl 2-methylpropionate) to prepare a monomer solution. Separately, 50 g of methyl ethyl ketone was placed in a 500-ml three-necked flask provided with a thermometer and a dropping funnel, followed by purging with nitrogen for 30 minutes. After the purging with nitrogen, the flask inside was heated to 80° C. with stirring with a magnetic stirrer. Using the dropping funnel, the above-prepared monomer solution was dropped into the flask in 3 hours. After the completion of the dropping, a reaction was allowed to take place for 1 hour; then, 1.17 g of 2,2-azobis-(methyl 2-methylpropionate) was added. Thereafter, a reaction was allowed to take place for 2 hours. The flask inside was cooled to 30° C. or lower to obtain a copolymer solution.

150 g of the copolymer solution obtained was transferred to a separatory funnel. In the separatory funnel were placed 50 g of methanol and 600 g of n-hexane. Separation and purification was conducted. After the separation, the lower layer fluid was recovered. The lower layer fluid recovered was diluted with methyl ethyl ketone to make the total volume 100 g. The solution was transferred to the separatory funnel. Therein were placed 50 g of methanol and 600 g of n-hexane, and separation and purification was conducted. After the separation, the lower layer fluid was recovered. The lower layer fluid recovered was substituted with 4-methyl-2-pentanol to make the total volume 250 g. Thereto was added 250 g of water, and separation and purification was conducted. After the separation, the upper layer fluid was recovered. The upper layer fluid recovered was substituted with 4-methyl-2-pentanol to obtain a resin solution. The resin solution was determined for solid concentration in the same manner as in the above Synthesis Example 1. The copolymer contained in the resin solution showed an Mw of 11,090, an Mw/Mn of 1.52 and a yield of 70%. This copolymer was named as resin (A-2).

Synthesis Example 3

First, there were prepared separately (i) a monomer solution in which 22.26 g of 1,1,1,3,3,3-hexafluoro-2-propyl methacrylate as a monomer for production of a repeating unit represented by the general formula (1-2) and 4.64 g of 2,2-azobis-(methyl 2-methylpropionate) were dissolved in 25 g of methyl ethyl ketone, and (ii) a monomer solution in which 27.74 g of 1,1,1-trifluoro-2-trifluoromethyl-2-hydroxy-4-pentyl methacrylate as a monomer for production of a repeating unit represented by the general formula (2-1) was dissolved in 25 g of methyl ethyl ketone. Separately, 100 g of methyl ethyl ketone was placed in a 500-ml three-necked flask provided with a thermometer and a dropping funnel, followed by purging with nitrogen for 30 minutes. After the purging with nitrogen, the flask inside was heated to 80° C. with stirring with a magnetic stirrer. Using the dropping funnel, the above-prepared monomer solution (i) was dropped in 20 minutes; the mixture was subjected to aging for 20 minutes; then, the monomer solution (ii) was dropped in 20 minutes. Thereafter, a reaction was allowed to take place for 1 hour, and the reaction mixture was cooled to 30° C. or lower to obtain a copolymer solution.

The copolymer solution was concentrated to 150 g. The concentrate was transferred to a separatory funnel. In the separatory funnel were placed 50 g of methanol and 400 g of n-hexane, and separation and purification was conducted. After the separation, the lower layer fluid was recovered. The lower layer fluid recovered was substituted with 4-methyl-2-pentanol to obtain a resin solution. The resin solution was determined for solid concentration in the same manner as in the Synthesis Example 1.

The copolymer contained in the resin solution showed an Mw of 5,730, an Mw/Mn of 1.23 and a yield of 26%. In the copolymer, the contents of the repeating unit derived from 1,1,1,3,3,3-hexafluoro-2-propyl methacrylate and the repeating unit derived from 1,1,1-trifluoro-2-trifluoromethyl-2-hydroxy-4-pentyl methacrylate were 50.3:49.7 (mol %). This copolymer was named as resin (B-1).

Synthesis Example 4

First, there were prepared separately (i) a monomer solution in which 9.84 g of 2,2,2-trifluoroethyl methacrylate as a monomer for production of a repeating unit represented by the general formula (1-2) and 6.74 g of 2,2-azobis-(methyl 2-methylisopropionate) were dissolved in 25 g of methyl ethyl ketone, and (ii) a monomer solution in which 40.16 g of 1,1,1-trifluoro-2-trifluoromethyl-2-hydroxy-4-pentyl methacrylate as a monomer for production of a repeating unit represented by the general formula (2-1) was dissolved in 25 g of methyl ethyl ketone. Separately, 100 g of methyl ethyl ketone was placed in a 500-ml three-necked flask provided with a thermometer and a dropping funnel, followed by purging with nitrogen for 30 minutes. After the purging with nitrogen, the flask inside was heated to 80° C. with stirring with a magnetic stirrer. Using the dropping funnel, the above-prepared monomer solution (i) was dropped in 20 minutes; the mixture was subjected to aging for 20 minutes; then, the monomer solution (ii) was dropped in 20 minutes. Thereafter, a reaction was allowed to take place for 1 hour, and the reaction mixture was cooled to 30° C. or lower to obtain a copolymer solution.

The copolymer solution was concentrated to 100 g. The concentrate was transferred to a separatory funnel. In the separatory funnel were placed 100 g of methanol and 800 g of n-hexane, and separation and purification was conducted. Aster the separation, the lower layer fluid was recovered. The lower layer fluid recovered was substituted with 4-methyl-2-pentanol, and the solution was washed with distilled water and again substituted with 4-methyl-2-pentanol to obtain a resin solution. The resin solution was determined for solid concentration in the same manner as in the Synthesis Example 1.

The copolymer contained in the resin solution showed an Mw of 5,880, an Mw/Mn of 1.58 and a yield of 68%. In the copolymer, the contents of the repeating unit derived from 2,2,2-trifluoroethyl methacrylate and the repeating unit derived from 1,1,1-trifluoro-2-trifluoromethyl-2-hydroxy-4-pentyl methacrylate were 30.6:69.4 (mol %). This copolymer was named as resin (B-2).

Synthesis Example 5

First, there was prepared a mixed solution containing, in 400 g of methyl ethyl ketone, 33.4 g of 2,2,2-trifluoroethyl methacrylate as a monomer for production of a repeating unit represented by the general formula (1-2), 166.6 g of 1,1,1-trifluoro-2-trifluoromethyl-2-hydroxy-4-pentyl methacrylate, and 24.6 g of 2,2-azobis(methyl 2-methylisopropionate). Separately, 200 g of methyl ethyl ketone was placed in a 1,000-ml three-necked flask provided with a thermometer and a dropping funnel, followed by purging with nitrogen for 30 minutes. After the purging with nitrogen, the flask inside was heated to 80° C. with stirring with a magnetic stirrer. Using the dropping funnel, the above-prepared mixture solution was dropped in 180 minutes and the mixture was subjected to aging for 180 minutes. Then, the flask inside was cooled to 30° C. or lower to obtain a copolymer solution.

The copolymer solution was concentrated to 400 g. The concentrate was transferred to a separatory funnel. In the separatory funnel were placed 133 g of methanol and 1,067 g of n-hexane, and separation and purification was conducted. Aster the separation, the lower layer fluid was recovered. To the lower layer fluid recovered were added 133 g of methanol, 133 g of methyl ethyl ketone and 1,066 g of n-hexane, and separation and purification was conducted. After the separation, the lower layer fluid was recovered. To the lower layer fluid recovered were added 133 g of methanol, 133 g of methyl ethyl ketone and 1,066 g of n-hexane, and separation and purification was conducted. After the separation, the lower layer fluid was recovered. The lower layer fluid recovered was substituted with 4-methyl-2-pentanol; the solution was washed with distilled water and again substituted with 4-methyl-2-pentnaol to obtain a resin solution. The resin solution was determined for solid concentration in the same manner as in the Synthesis Example 1.

The copolymer contained in the resin solution showed an Mw of 5,100, an Mw/Mn of 1.35 and a yield of 60%. In the copolymer, the contents of the repeating unit derived from 2,2,2-trifluoroethyl methacrylate and the repeating unit derived from 1,1,1-trifluoro-2-trifluoromethyl-2-hydroxy-4-pentyl methacrylate were 25.5:74.5 (mol %). This copolymer was named as resin (B-3).

Synthesis Example 6

First, there was prepared a mixed solution in which 25.0 g 2,2-azobis(methyl 2-methylisopropionate) was dissolved in 25.0 g of methyl ethyl ketone. Separately, in a 2,000-ml three-necked flask provided with a thermometer and a dropping funnel were placed 104.6 g of 1,1,1,3,3,3-hexafluoro-2-propyl methacrylate as a monomer for production of a repeating unit represented by the general formula (1-2), 195.4 g of 1,1,1-trifluoro-2-trfluoromethyl-2-hydroxy-4-pentyl methacrylate and 575.0 g of methyl ethyl ketone, followed by purging with nitrogen for 30 minutes. After the purging with nitrogen, the flask inside was heated to 80° C. with stirring with a magnetic stirrer. Using the dropping funnel, the above prepared mixed solution was dropped in 5 minutes and the mixture was subjected to aging for 360 minutes. Then, the flask inside was cooled to 30° C. or lower to obtain a copolymer solution.

The copolymer solution was concentrated to 600 g. The concentrate was transferred to a separatory funnel. In the separatory funnel were placed 193 g of methanol and 1,542 g of n-hexane, and separation and purification was conducted. Aster the separation, the lower layer fluid was recovered. To the lower layer fluid recovered were added 117 g of methyl ethyl ketone and 1,870 g of n-hexane, and separation and purification was conducted. After the separation, the lower layer fluid was recovered. To the lower layer fluid recovered were added 93 g of methanol, 77 g of methyl ethyl ketone and 1,238 g of n-hexane, and separation and purification was conducted. After the separation, the lower layer fluid was recovered. The lower layer fluid recovered was substituted with 4-methyl-2-pentanol; the solution was washed with distilled water and again substituted with 4-methyl-2-pentnaol to obtain a resin solution. The resin solution was determined for solid concentration in the same manner as in the Synthesis Example 1.

The copolymer contained in the resin solution showed an Mw of 10,200, an Mw/Mn of 1.65 and a yield of 65%. In the copolymer, the contents of the repeating unit derived from 1,1,1,3,3,3-hexafluoro-2-propyl methacrylate and the repeating unit derived from 1,1,1-trifluoro-2-trifluoromethyl-2-hydroxy-4-pentyl methacrylate were 39.5:60.5 (mol %). This copolymer was named as resin (B-4)

[Preparation of Photoresist Compositions (α) to (γ)]

Photoresist compositions (α) to (γ) for formation of photoresist film were prepared by mixing resins (α-1) to (α-3) for photoresist composition, acid-generating agents (C), an acid diffusion-controlling agent (D) and solvents (E) in amounts shown in Table 1, adjusting the total solid concentration of each mixture to 0.2 to 20% by mass, and filtering the mixture through a filter having a pore diameter of 30 nm. Methods for synthesis of the resins (α-1) to (α-3) for photoresist composition are described below.

Synthesis Example 7

First, in 200 g of 2-butanone were dissolved 53.93 g (50 mol %) of a compound to constitute the following repeating unit (M-1), 35.38 g (40 mol %) of a compound to constitute the following repeating unit (M-2) and 10.69 g (10 mol %) of a compound to constitute the following repeating unit (M-3). Therein was placed 5.58 g of dimethyl 2,2'-azobis(2-methylpropionate), to prepare a monomers solution. Separately, 100 g of 2-butanone was placed in a 500-ml three-necked flask provided with a thermometer and a dropping funnel, followed by purging with nitrogen for 30 minutes. After the purging with nitrogen, the flask inside was heated to 80° C. with stirring with a magnetic stirrer. Using the dropping funnel, the above-prepared monomers solution was dropped in 3 hours. A polymerization reaction was allowed to take place for 6 hours (the timing of dropping start was taken as the start of polymerization). After the completion of the polymerization, the polymerization mixture was cooled to 30° C. or lower by water cooling. After the cooling, 2,000 g of methanol was placed therein and a white powder separated out. The white powder was collected by filtration and washed with 400 g of methanol twice on a slurry. Then, filtration was conducted, followed by drying at 50° C. for 17 hours to obtain a white powder copolymer (74 g, yield: 74%).

[Formula 7]

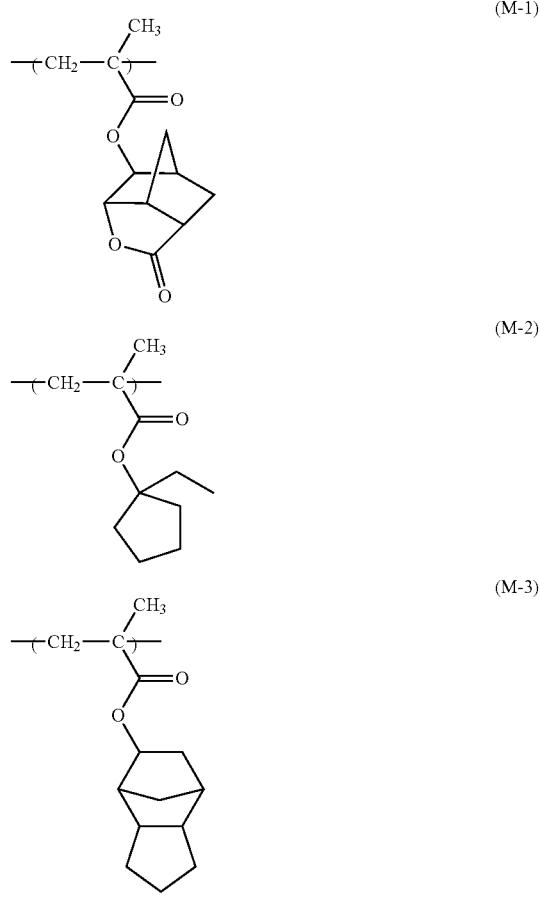

The copolymer showed an Mw of 6,900 and an Mw/Mn of 1.70. $^{13}$C-NMR analysis indicated that, in the copolymer, the contents of the repeating unit (M-1), the repeating unit (M-2) and the repeating unit (M-3) were 53.0:37.2:9.8 (mol %) and the content of the acid-dissociable group-containing repeating unit was 37.2 mol % relative to the total repeating units. The copolymer was named as resin (α-1) for photoresist composition.

Synthesis Example 8

First, in 200 g of 2-butanone were dissolved 47.54 g (46 mol %) of a compound to constitute the following repeating unit (M-1), 12.53 g (15 mol %) of a compound to constitute the following repeating unit (M-2) and 39.93 g (39 mol %) of a compound to constitute the following repeating unit (M-4). Therein was placed 4.08 g of 2,2'-azobis(isobutyronitrile) to prepare a monomers solution. Separately, 100 g of 2-butanone was placed in a 1,000-ml three-necked flask provided with a thermometer and a dropping funnel, followed by purging with nitrogen for 30 minutes. After the purging with nitrogen, the flask inside was heated to 80° C. with stirring with a magnetic stirrer. Using the dropping funnel, the above-prepared monomers solution was dropped in 3 hours. A polymerization reaction was allowed to take place for 6 hours (the timing of dropping start was taken as the start of polymerization). After the completion of the polymerization, the polymerization mixture was cooled to 30° C. or lower by water cooling. After the cooling, 2,000 g of methanol was placed therein and a white powder separated out. The white powder was collected by filtration and washed with 400 g of methanol twice on a slurry. Then, filtration was conducted, followed by drying at 50° C. for 17 hours to obtain a white powder copolymer (73 g, yield: 73%).

The copolymer showed an Mw of 5,700 and an Mw/Mn of 1.70. $^{13}$C-NMR analysis indicated that, in the copolymer, the contents of the repeating unit (M-1), the repeating unit (M-2) and the repeating unit (M-4) were 51.4:14.6:34.0 (mol %) and the content of the acid-dissociable group-containing repeating unit was 48.6 mol % relative to the total repeating units. The copolymer was named as resin (α-2) for photoresist composition.

Synthesis Example 9

First, in 200 g of 2-butanone were dissolved 55.44 g (50 mol %) of a compound to constitute the following repeating unit (M-1), 33.57 g (40 mol %) of a compound to constitute the following repeating unit (M-5) and 10.99 g (10 mol %) of a compound to constitute the following repeating unit (M-3). Therein was placed 5.74 g of dimethyl 2,2'-azobis(2-methylpropionate), to prepare a monomers solution. 100 g of 2-butanone was placed in a 500-ml three-necked flask, and the flask inside was purged with nitrogen for 30 minutes. After the purging with nitrogen, the reactor was heated to 80° C. with stirring, and the above-prepared monomers solution was placed therein in 3 hours, using the dropping funnel. A polymerization reaction was allowed to take place for 6 hours (the timing of dropping start was taken as the start of polymerization). After the completion of the polymerization, the polymerization mixture was cooled to 30° C. or lower by water cooling. Therein was placed 2,000 g of methanol and a white powder separated out. The white powder was collected by filtration and washed with 400 g of methanol twice on a slurry. Then, filtration was conducted, followed by drying at 50° C. for 17 hours to obtain a white powder copolymer (72 g, yield: 72%).

[Formula 8]

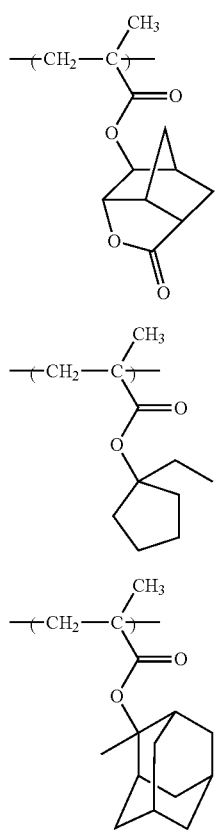

[Formula 9]

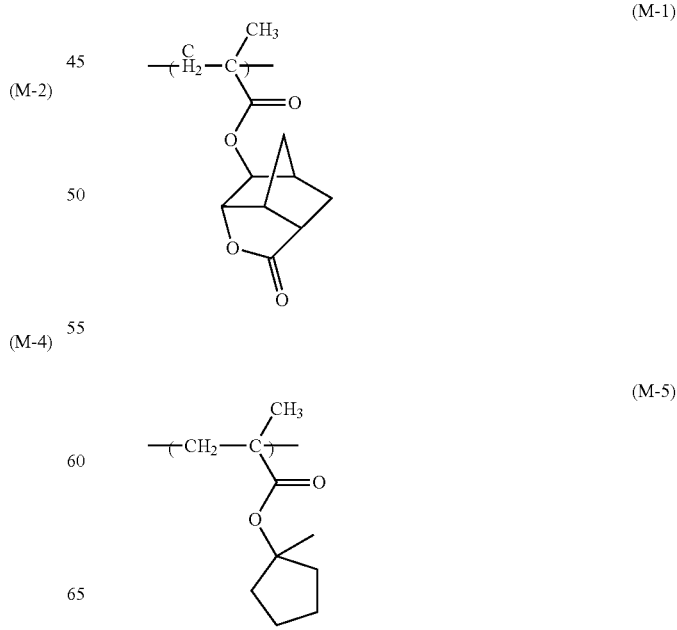

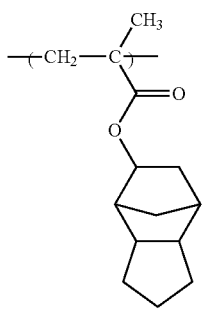

(M-3)

The copolymer showed an Mw of 6,400 and an Mw/Mn of 1.67. $^{13}$C-NMR analysis indicated that, in the copolymer, the contents of the repeating unit (M-1), the repeating unit (M-5) and the repeating unit (M-3) were 52.2:38.1:9.7 (mol %) and the content of the acid-dissociable group-containing repeating unit was 38.1 mol % relative to the total repeating units. The copolymer was named as resin (α-3) for photoresist composition.

Incidentally, in the resin (α-3) for photoresist composition, the content of low-molecular component derived from each monomer was 0.02% by mass relative to 100% by mass of the resin (α-3) for photoresist composition.

Components shown in Table 1, other than the resins (α-1) to (α-3) for photoresist composition, contained in the photoresist compositions (α) to (γ) are shown below.

[Acid-Generating Agents (C)]
C-1: triphenylsulfonium-nonafluoro-n-butanesulfonate
C-2: 1-(4-n-butoxynaphthalen-1-yl)tetrahydrothiophenium-nonafluoro-n-butanesulfonate
C-3: triphenylsulfonium 2-(bicyclo[2.2.1]hept-2'-yl)-1,1,2,2-tetrafluoroethanesulfonate
C-4: 1-(4-n-butoxynaphthyl)tetrahydrothiophenium 2-(bicyclo[2.2.1]hept-2'-yl)-1,1,2,2-tetrafluoroethanesulfonate
[Acid Diffusion-Controlling Agent (D)]
D-1: R-(+)-(tert-butoxycarbonyl)-2-piperidinemethanol
[Solvents (E)]
E-1: propylene glycol monomethyl ether acetate
E-2: cyclohexanone
E-3: γ-butyrolactone soamyl ether ("F-2" in Table 2) as a solvent (an alkyl ether having an alkyl chain of 4 to 10 carbon atoms). The mixture was stirred for 2 hours and then filtered through a filter having a pore diameter of 200 nm to prepare a composition for formation of upper layer film (a coating fluid) having a solid concentration of 4%. On this composition for formation of upper layer film were made various ratings according to the [Rating methods] shown below.

[Rating Methods]
(1) Rating Method for Removability of Upper Layer Film (Removability)

A composition for formation of upper layer film was spin-coated on an 8-inch silicon wafer using "CLEAN TRACK ACT 8" (trade name, a product of Tokyo Electron), followed by baking at 90° C. for 60 seconds to form a coating film (an upper layer film) having a film thickness of 90 nm. Incidentally, the thickness of coating film (film thickness) was measured using Lambda Ace VM 90 (trade name, a product of Dainippon Screen). Paddle development (developing solution: a 2.38% aqueous TMAH solution) was conducted for 60 seconds using "CLEAN TRACK ACT (trade name); swinging was conducted for spin-drying; then, the surface of the wafer was observed. The rating was "○" when there was no residue on the wafer surface after the development, and was "X" when residue was observed on the wafer surface. The result of the rating is shown in Table 2. Incidentally, in Table 2, "Removability" indicates this rating.

(2) Measurement Method of Receded Contact Angle

The photoresist composition (α) was spin-coated on an 8-inch silicon wafer and then PB was conducted on a hotplate at 90° C. for 60 seconds to form a coating film (a photoresist film) having a film thickness of 120 nm. Then, using "DSA-10" (trade name, a product of KRUS), receded contact angle was measured quickly at room temperature (23° C.), at a humidity of 45% and at normal pressure, according to the following procedure.

The wafer stage position of "DSA-10" (trade name, a product of KRUS) was adjusted. The above-mentioned wafer was set on the adjusted stage. Next, water was injected into a needle and the position of the needle was adjusted finely at its initial position from which a water drop could be formed on the wafer. Then, the water was discharged from the needle to form a water drop of 25 μl on the wafer. Once the needle was

TABLE 1

|  | Resins for photoresist composition | | | Acid-generating agents (C) | | Acid diffusion-controlling agent (D) | | Solvents (E) | |
|---|---|---|---|---|---|---|---|---|---|
|  | Kinds | Parts | Acid-dissociable group-containing repeating unit (mol %) | Kind | Parts | Kind | Parts | Kind | Parts |
| Photoresist composition (α) | α-1 | 30 | 37.2 | C-1 | 4 | D-1 | 0.83 | E-1 | 1710 |
|  | α-2 | 70 |  | C-2 | 5 | — | — | E-2 | 730 |
| Photoresist composition (β) | α-3 | 100 | 48.6 | C-3 | 6.5 | D-1 | 1.1 | E-1 | 1400 |
|  | — | — |  | C-4 | 2 | — | — | E-2 | 600 |
|  | — | — |  | — | — | — | — | E-3 | 30 |
| Photoresist composition (γ) | α-1 | 100 | 38.1 | C-1 | 1.5 | D-1 | 0.65 | E-1 | 2400 |
|  | — | — |  | C-2 | 6 | — | — | E-3 | 30 |

Example 1

There were mixed 100 parts of the resin (A-1) as the resin (A), 10 part of the resin (B-1) as the resin (B), 1,680 parts of 4-methyl-2-pentnaol ("F-1" in Table 2) as a solvent (an alcohol having 4 to 10 carbon atoms), and 1,120 parts of diisoamyl ether withdrawn from the water drop, and the needle was lowered to the above initial position and was inserted into the water drop. Successively, the water drop was sucked by the needle for 90 seconds at a rate of 10 μl/min. In parallel with this, contact angle was measured once every second (90 times in total). Of these contact angles measured, contact angles of 20 seconds from the timing at which the measured value of contact angle had stabilized, were averaged, and the average value was taken as "receded contact angle (°)" The result of measurement is shown in Table 2. Incidentally, in Table 2, "Receded contact angle (°)" indicates this measurement.

(3) Rating Method for Intermixing

This rating was conducted in order to examine the prevention of intermixing of upper layer film with photoresist film. First, an 8-inch silicon wafer was subjected to a HMDS treatment (100 seconds, 60 seconds) using "CLEAN TRACK ACT 8" (trade name). Thereon was spin-coated the photoresist composition (α). PB was conducted on a hot plate at 90° C. for 60 seconds to form a coating film (a photoresist film) having a film thickness of 120 nm. On the coating film was spin-coated a composition for formation of upper layer film, followed by PB (90° C. for 60 seconds) to form a coating film having a film thickness of 90 nm. Ultra-pure water was discharged onto the wafer from "CLEAN TRACK ACT 8" (trade name) for 60 seconds, and swinging was conducted at 4,000 rpm for 15 seconds for spin-drying. Then, paddle development (developing solution: a 2.38% aqueous. TMAH solution) was conducted for 60 seconds with a LD nozzle using "CLEAN TRACK ACT 8" (trade name), to remove the upper layer film. The upper layer film was removed by the development but the photoresist film remained as it was, owing to no irradiation. Before and after the development, the film thickness of photoresist film was measured using "Lambda Ace VM 90" (trade name, a product of Dainippon Screen). The rating was "○" when the change of film thickness was 5% or less, based on a judgement that there was no intermixing between the photoresist film and the upper layer film, and was "X" when the change of film thickness was more than 5%. The result of rating is shown in Table 2. Incidentally, in Table 2, "Intermixing" indicates this rating.

(4) Measurement of Dissolution Amount (Dissolution)

Figure 2:
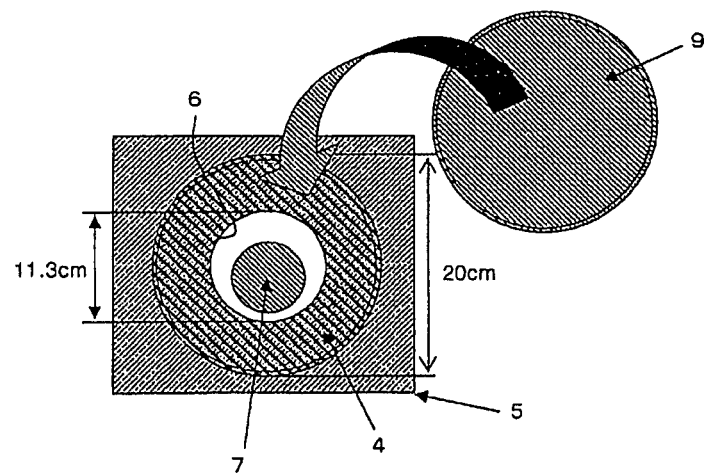
FIG. 2 is a view schematically showing a state in which, in measuring the dissolved amount of the upper layer film formed with the composition for formation of upper layer film, of the present invention, an 8-inch silicon wafer is mounted on a silicon rubber sheet so that there is no leakage of ultra-pure water.
Figure 3:
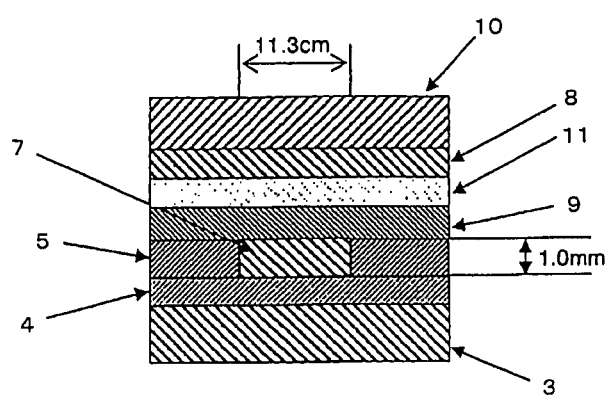
FIG. 3 is a sectional view in a state in which the dissolved amount of the upper layer film formed with the composition for formation of upper layer film, of the present invention is measured.

As shown in FIGS. 2 and 3, there was prepared an 8-inch silicon wafer 3 on which an HMDS (hexamethyldisilazane)-treated layer 4 had been formed at 100° C. for 60 seconds using "CLEAN TRACK ACT 8" (a product of Tokyo Electron). On the side of HMDS-treated layer of the 8-inch silicon water 3 was placed a silicon rubber sheet 5 (a product of Kureha Elastomer, thickness: 1.0 mm, shape: a square of 30 cm×30 cm) whose central circular portion of 11.3 cm in diameter was removed completely. At this time, the removed (hollow) central portion 6 of the silicon rubber sheet 5 was placed at the center of the 8-inch silicon wafer 3. Then, 10 ml of ultra-pure water 7 was filled in the hollow portion 6 of the silicon rubber sheet 5, using a 10-ml transfer pipette.

Separately, there was prepared an 8-inch silicon wafer 10 other than the above-mentioned 8-inch silicon wafer 3, on which a lower layer anti-reflection film 8, a resist film 11 and an upper layer film 9 had been formed. This 8-inch silicon wafer 10 was placed so that the upper layer film 9 contacted with the silicon rubber sheet 5, that is, the upper layer film 9 contacted with the ultra-pure water 7 but there occurred no leakage of the ultra-pure water 7.

Incidentally, the formation of the lower layer anti-reflection film 8, the resist film 11 and the upper layer film 9 on the 8-inch silicon wafer 10 was conducted as follows. First, a composition for lower layer anti-reflection film ("ARC 29A", a product of Brewer Science) was coated using the above-mentioned "CLEAN TRACK ACT 8", so as to form a lower layer anti-reflection film having a film thickness of 77 nm. Then, the photoresist composition (α) was spin-coated on the lower layer anti-reflection film using the "CLEAN TRACK ACT 8", followed by baking at 115° C. for 60 seconds, to form a resist film 11 having a film thickness of 205 nm.

Thereafter, on the resist film 11 was coated a composition for formation of upper layer film, to form an upper layer film 9.

Mounting was made so that the upper layer film 9 was on the silicon rubber sheet 5. This state was kept for 10 seconds. Then, the 8-inch silicon wafer 10 was removed, and the ultra-pure water 7 being in contact with the upper layer film 9 was recovered using a glass syringe. This recovered ultra-pure water 7 was used as a analytical sample. Incidentally, the recovery of the ultra-pure water filled in the hollow portion 6 of the silicon rubber sheet 5 was 95% or more.

Successively, the peak intensity of the anion moiety of the light-sensitive, acid-generating agent in the analytical sample (ultra-pure water) obtained was measured using a LC-MS (a liquid chromatograph mass spectrometer) (LC unit: "SERIES 1100" (a product of AGILENT); MS unit: "Mariner" (a product of Perseptive Biosystems, Inc.)), under the following measurement conditions. In this case, for the light-sensitive, acid-generating agent used in the photoresist composition (α), the peak intensities of aqueous solutions containing 1 ppb, 10 ppb and 100 ppb of the agent were measured under the same conditions as used for the analytical sample, to prepare a calibration curve. Using this calibration curve, the dissolution amount of light-sensitive, acid-generating agent (anion moiety) in water was calculated.

(Measurement Conditions)

One column of "CAPCELL PAK MG" (a product of Shiseido) was used. Water/methanol (3/7) containing 0.1 mass % of formic acid was used as an elutant. The flow rate was 0.2 ml/min and the measurement temperature was 35° C.

In the same manner, for the acid diffusion-controlling agent, the peak intensities of aqueous solutions containing 1 ppb, 10 ppb and 100 ppb of the agent were measured under the same conditions as used for the analytical sample, to prepare a calibration curve. Using this calibration curve, the dissolution amount of acid diffusion-controlling agent in water was calculated. The rating of dissolution amount was "X" when the total of the above-calculated dissolution amount of the anion moiety of the light-sensitive, acid-generating agent and the above-calculated dissolution amount of the acid diffusion-controlling agent was $5.0 \times 10^{-12}$ mol/cm² or more, and was "○" when the total was $5.0 \times 10^{-12}$ mol/cm² or less. The result of rating is shown in Table 2. Incidentally, in Table 2, "Dissolution" indicates this rating.

(5) Rating Method for Blob Defect

There was prepared an 8-inch silicon wafer which had been subjected to an HMDS (hexamethyldisilazane) treatment at 100° C. for 60 seconds using "CLEAN TRACK ACT 8" (a product of Tokyo Electron). On this 8-inch silicon wafer was spin-coated the photoresist composition (a), followed by PB at 90° C. for 60 seconds, to form a coating film having a film thickness of 120 nm. On the coating film was spin-coated a composition for formation of upper layer film, followed by PB at 90° C. for 60 seconds, to form a coating film having a film thickness of 90 nm. Then, exposure was conducted via a ground glass having no pattern formed thereon. The resulting wafer was used for rating of blob defect.

First, ultra-pure water was discharged onto the above 8-inch silicon wafer for 60 seconds from the rinse nozzle of "CLEAN TRACK ACT 8". Swinging was conducted at 4,000 rpm for 15 seconds for spin-drying. Then, paddle development was conducted for 60 seconds using the LD nozzle of the above described "CLEAN TRACK ACT 8" to remove the upper layer film. Incidentally, in the paddle development, a 2.38% aqueous TMAH solution was used as a developing solution. After the development, the extent of the upper layer film remaining undissolved was examined by "KLA 2351" (a product of KLA Tencor) for rating of blob defect. The rating of blob defect was "○" when the number of defects by development peeling (blob defects) detected was 200 or less, and was "X" when the number exceeded 200. The result of rating is shown in Table 2. Incidentally, in Table 2, "Blob defect" indicates this rating.

(6) Rating of Patterning

This rating was conducted to evaluate the formability of resist pattern of high resolution. First, on an 8-inch silicon wafer was spin-coated a composition for formation of lower layer anti-reflection film ["ARC 29A" (trade name), a product of Brewer Science] using "CLEAN TRACK ACT 8" (trade name), followed by PB at 205° C. for 60 seconds, to form a coating film (a lower layer anti-reflection film) having a film thickness of 77 nm. On the lower layer anti-reflection film was spin-coated the photoresist composition (α), followed by PB at 90° C. for 60 seconds, to form a coating film (a photoresist film) having a film thickness of 120 nm.

On the photoresist film was spin-coated a composition for formation of upper layer film, followed by PB at 90° C. for 60 seconds, to form a coating film (an upper layer film) having a film thickness of 90 nm. Then, exposure was conducted using an ArF projection aligner (Model "S306C", a product of Nikon) under the optical conditions of NA: 0.78, sigma: 0.85, ⅔A nn. Ultra-pure water was discharged onto the wafer for 60 seconds from the rinse nozzle of "CLEAN TRACK ACT 8" (trade name), and swinging was conducted at 4,000 rpm for 15 seconds for spin-drying. Then, PEB was conducted at 115° C. for 60 seconds using the hot plate of "CLEAN TRACK ACT 8" (trade name), after which paddle development (developing solution: a 2.38% aqueous TMAH solution) was conducted for 30 seconds using the LD nozzle. Rinsing with ultra-pure water was conducted and then swinging was conducted at 4,000 rpm for 15 seconds for spin-drying.

With respect to the resist pattern obtained, the exposure energy required for formation of a line and space pattern (1L1S) of 90 nm line width in a 1:1 line width was taken as optimum exposure energy. Incidentally, a scanning electron microscope ["S-9380" (trade name), a product of Hitachi Keisokuki] was used for the measurement. The sectional shape of the line and space pattern of 90 nm line width was observed using a scanning electron microscope (Model "S-4200", a product of Hitachi Keisokuki). FIG. 1 is a sectional view schematically showing the shape of the line and space pattern. The line width Lb at the middle of the film of the pattern 2 formed on a substrate 1 and the line width La at the top of the film were measured. The rating was "○" in the case of $0.9 \leftarrow (La-Lb)/Lb \leftarrow 1.1$, and was "X" in the case of $(La-Lb)/Lb < 0.9$ or $(La-Lb)/Lb > 1.1$. The result of rating is shown in Table 2. Incidentally, in Table. 2, "Patterning" indicates this rating.

In the upper layer film formed with the composition for formation of upper layer film, of the present Example, the removability was "○", the receded contact angle was 71.4°, the intermixing was "○", the dissolution was "○", the blob defect was "○", and the patterning was "○".

Examples 2 to 13, Comparative Examples 1 to 2

Each composition for formation of upper layer film was prepared in the same manner as in Example 1 except that its formulation shown in Table 2 was used. Then, each upper layer film was formed. Various ratings were made for each upper layer film. The results obtained are shown in Tables 2 and 3.

TABLE 2

| | Photo-resist composition | Composition for formation of upper layer film | | | | | | | | [Rating] | | | | | |
| | | Resin (A) | | Resin (B) | | Solvents (F) | | | | Remova-bility | Receded contact angle (°) | Inter-mixing | Dissolution | Blob defect | Patterning |
| | | Kind | Parts | Kind | Parts | Kind | Parts | Kind | Parts | | | | | | |
| Ex. 1 | α | A-1 | 100 | B-1 | 10 | F-1 | 1680 | F-2 | 1120 | ○ | 71.4 | ○ | ○ | ○ | ○ |
| Ex. 2 | α | A-1 | 100 | B-1 | 15 | F-1 | 1680 | F-2 | 1120 | ○ | 72.0 | ○ | ○ | ○ | ○ |
| Ex. 3 | α | A-1 | 100 | B-1 | 20 | F-1 | 1680 | F-2 | 1120 | ○ | 73.1 | ○ | ○ | ○ | ○ |
| Ex. 4 | α | A-1 | 50 | B-2 | 50 | F-1 | 1680 | F-2 | 1120 | ○ | 70.5 | ○ | ○ | ○ | ○ |
| Ex. 5 | α | A-1 | 40 | B-2 | 60 | F-1 | 1680 | F-2 | 1120 | ○ | 71.1 | ○ | ○ | ○ | ○ |
| Ex. 6 | α | A-1 | 30 | B-2 | 70 | F-1 | 1680 | F-2 | 1120 | ○ | 72.1 | ○ | ○ | ○ | ○ |
| Comp. Ex. 1 | α | A-1 | 100 | — | — | F-1 | 2800 | — | — | ○ | 69.0 | ○ | ○ | ○ | ○ |
| Comp. Ex. 2 | α | A-2 | 100 | — | — | F-1 | 2800 | — | — | ○ | 74.0 | ○ | ○ | x | x |

TABLE 3

| | Photo-resist composition | Composition for formation of upper layer film | | | | | | | | [Rating] | | | | | |
| | | Resin (A) | | Resin (B) | | Solvents (F) | | | | Remova-bility | Receded contact angle (°) | Inter-mixing | Dissolution | Blob defect | Patterning |
| | | Kind | Parts | Kind | Parts | Kind | Parts | Kind | Parts | | | | | | |
| Ex. 7 | α | A-1 | 50 | B-3 | 50 | F-1 | 1680 | F-2 | 1120 | ○ | 70.5 | ○ | ○ | ○ | ○ |
| Ex. 8 | α | A-1 | 40 | B-3 | 60 | F-1 | 1680 | F-2 | 1120 | ○ | 71.2 | ○ | ○ | ○ | ○ |
| Ex. 9 | α | A-1 | 30 | B-3 | 70 | F-1 | 1680 | F-2 | 1120 | ○ | 72.0 | ○ | ○ | ○ | ○ |
| Ex. 10 | α | A-1 | 7 | B-4 | 93 | F-1 | 1680 | F-2 | 1120 | ○ | 72.0 | ○ | ○ | ○ | ○ |

TABLE 3-continued

| | Photo-resist composition | Composition for formation of upper layer film | | | | | | | [Rating] | | | | | |
|---|---|---|---|---|---|---|---|---|---|---|---|---|---|---|
| | | Resin (A) | | Resin (B) | | Solvents (F) | | | Remova-bility | Receded contact angle (°) | Inter-mixing | Dissolution | Blob defect | Patterning |
| | | Kind | Parts | Kind | Parts | Kind | Parts | Kind | Parts | | | | | |
| Ex. 11 | α | A-1 | 20 | B-4 | 80 | F-1 | 1680 | F-2 | 1120 | ○ | 73.8 | ○ | ○ | ○ | ○ |
| Ex. 12 | α | A-1 | 30 | B-4 | 70 | F-1 | 1680 | F-2 | 1120 | ○ | 74.5 | ○ | ○ | ○ | ○ |
| Ex. 13 | α | A-1 | 40 | B-4 | 60 | F-1 | 1680 | F-2 | 1120 | ○ | 75.6 | ○ | ○ | ○ | ○ |

As is clear from Tables 2 and 3, the compositions for formation of upper layer film, of Examples 1 to 13, as compared with those of Comparative Examples 1 to 2, could each form an upper layer film having a sufficiently high receded contact angle and were each good in rating of defect (e.g. blob defect).

Examples 14 to 15, Comparative Examples 3 to 5

Each composition for formation of upper layer film was prepared in the same manner as in Example 1 except that its formulation shown in Table 4 was used. Then, using this composition for formation of upper layer film, each upper layer film was formed on a photoresist film. A resist pattern was formed; the upper layer film was removed; and the resist pattern of photoresist film was rated. Specifically, ratings shown below were made. The results obtained are shown in Table 4.

(7) Sensitivity

There was used, as a substrate, a 12-inch silicon wafer on which a lower layer anti-reflection film of 77 nm in film thickness ("ARC 29A", a product of Brewer Science) had been formed. In the formation of the lower layer anti-reflection film, "CLEAN TRACK ACT 12" (a product of Tokyo Electron) was used.

On the substrate was spin-coated the photoresist composition (β) using the CLEAN TRACK ACT 12, followed by PB at 115° C. for 60 seconds, to obtain a photoresist film of 120 nm in film thickness. Then, on the photoresist film was spin-coated a composition for formation of upper layer film, followed by PB at 90° C. for 60 seconds, to obtain a coating film (an upper layer film) of 90 nm in film thickness. Then, exposure was conducted via a mask pattern using an ArF excimer laser liquid immersion projection aligner ("ASML AT 1250i", a product of ASML) under the conditions of NA=0.85, $\sigma_0/\sigma_1$=0.96/0.76 and Dipole. At this time, pure water was placed as a liquid immersion medium between upper surface of the resist (photoresist film) and the lens of the aligner. After the exposure, PB was conducted at 115° C. for 60 seconds. Then, development was conducted at 23° C. for 60 seconds using a 2.38 mass % aqueous tetramethylammonium hydroxide solution, followed by water washing and drying, to form a positive resist pattern. In this case, the exposure energy required for formation of a line and space pattern (1L1S) of 65 nm line width in a 1:1 line width was taken as optimum exposure energy. This optimum exposure energy was indicated as sensitivity. Incidentally, a scanning electron microscope ("S-9380", a product of Hitachi High Technologies) was used in the measurement.

(8) Depth of Focus (DOF)

A line and space pattern (1L1S) of 65 nm line width was formed in the same manner as in the above-mentioned measurement of sensitivity, and there was measured a depth of focus (DOF) at the exposure energy required for the formation of the above line and space pattern in a 1:1 line width, that is, at the sensitivity (optimum exposure energy) shown in

TABLE 4

| | Photo-resist composition | Composition for formation of upper layer film | | | | | | | Rating | | | | |
|---|---|---|---|---|---|---|---|---|---|---|---|---|---|
| | | Resin (A) | | Resin (B) | | Solvents (F) | | | Sensitivity (Liquid immersion exposure) (mJ/cm²) | Depth Of focus (nm) | Pattern shape | Defects | |
| | | Kind | Parts | Kind | Parts | Kind | Parts | Kind | Parts | | | | Bridge | Water mark |
| Ex. 14 | β | A-1 | 100 | B-1 | 15 | F-1 | 1680 | F-2 | 1120 | 27 | 500 | Good | — | — |
| Ex. 15 | β | A-1 | 30 | B-2 | 70 | F-1 | 1680 | F-2 | 1120 | 27 | 500 | Good | — | — |
| Ex. 16 | γ | A-1 | 100 | B-1 | 15 | F-1 | 1680 | F-2 | 1120 | — | — | — | 0 | 2 |
| Ex. 17 | γ | A-1 | 30 | B-2 | 70 | F-1 | 1680 | F-2 | 1120 | — | — | — | 1 | 2 |
| Comp. Ex. 3 | β | A-1 | 100 | — | — | F-1 | 2800 | — | — | 24 | 500 | Good | — | — |
| Comp. Ex. 4 | β | A-1 | 100 | — | — | F-1 | 1680 | F-2 | 1120 | 24 | 500 | Good | — | — |
| Comp. Ex. 5 | β | No formation of upper layer film | | | | | | | | 26 | 500 | Bad | — | — |
| Comp. Ex. 6 | γ | A-1 | 100 | — | — | F-1 | 2800 | — | — | — | — | — | 2 | 2 |
| Comp. Ex. 7 | γ | A-1 | 100 | — | — | F-1 | 1680 | F-2 | 1120 | — | — | — | 2 | 4 |
| Comp. Ex. 8 | γ | No formation of upper layer film | | | | | | | | — | — | — | 2 | 22 |

Table 4, using a scanning electron microscope ("S-9380", a product of Hitachi High Technologies).

(9) Sectional Shape of Pattern

A line and space pattern (1L1S) of 65 nm line width was formed in the same manner as in the above-mentioned measurement of sensitivity. The sectional shape of the line and space pattern (1L1S) was observed using "S-4800" (a product of Hitachi High Technologies). There were measured a line width Lb at the middle of the resist pattern and a line width La at the top of the pattern film, as shown in FIG. 1. The sectional shape of pattern was "good" when the measured values were in a range of $0.9 \leftarrow (La-Lb)/Lb \leftarrow 1.1$, and was "bad" when the measured values were out of this range.

As is clear from Table 4, the compositions for formation of upper layer film, of Examples 14 and 15, as compared with those of Comparative Examples 3 to 5, could each form a resist film good in sensitivity, depth of focus (DOF) and pattern sectional shape.

Examples 16 and 17, and Comparative Examples 6 to 8

Each composition for formation of upper layer film was prepared in the same manner as in Example 1 except that its formulation shown in Table 4 was used. Then, using this composition for formation of upper layer film, each upper layer film was formed on a photoresist film. A resist pattern was formed; the upper layer film was removed; and the resist pattern of photoresist film was rated. Specifically, the following rating was made. The results obtained are shown in Table 4.

(10) Defects (Small Bridge-Like Defect and Water Mark Defect)

There was used, as substrate, a 12-inch silicon wafer on which a lower layer anti-reflection film of 77 nm film thickness ("ARC 29A", a product of Brewer Science) had been formed. Incidentally, in the formation of this lower layer anti-reflection film, "CLEAN TRACK ACT 12" (a product of Tokyo Electron) was used.

On the substrate was spin-coated the photoresist composition (β) using the above-mentioned CLEAN TRACK ACT 12, followed by PB at 115° C. for 60 seconds, to obtain a photoresist film of 120 nm film thickness. Then, on the photoresist film was spin-coated a composition for formation of upper layer film, followed by PB at 90° C. for 60 seconds, to obtain a coating film (an upper layer film) of 90 nm film thickness. Then, exposure was conducted via a mask pattern using an ArF excimer laser liquid immersion projection aligner ("ASML AT 1250i", a product of ASML) under the conditions of NA=0.85, $\sigma_0/\sigma_1$=0.96/0.76 and Annular. At this time, pure water was placed as a liquid immersion medium between upper surface of the resist (photoresist film) and the lens of the aligner. After the exposure, PB was conducted at 115° C. for 60 seconds. Then, development was conducted at 23° C. for 60 seconds using a 2.38 mass % aqueous tetramethylammonium hydroxide solution, followed by water washing and drying, to form a positive resist pattern. In this case, the exposure energy required for formation of a line and space pattern (1L1S) of 100 nm line width in a 1:1 line width was taken as optimum exposure energy. This optimum exposure energy was indicated as sensitivity. Incidentally, a scanning electron microscope ("S-9380", a product of Hitachi High Technologies) was used in the measurement.

Then, defects on the line and space pattern (1L1S) of 100 nm line width were measured using "KLA 2351" (a product of KLA-Tencor). Specifically explaining, the defects measured by "KLA 2351" were observed using a scanning electron microscope ("S-9380", a product of Hitachi High Technologies), and the small bridge-like defect and the water mark defect anticipated to be derived from the ArF excimer laser liquid immersion exposure were distinguished from each other. The respective numbers of these defects were measured and reported separately. The results are shown in Table 4 (the small bridge-like defect is indicated as "Bridge" and the water mark defect is indicated as "Water mark"). Incidentally, the small bridge-like defect is observed even in an ordinary ArF excimer laser exposure in which no pure water is filled between a photoresist film and a ray source lens.

As is clear from Table 4, the compositions for formation of upper layer film, of Examples 16 and 17, as compared with those of Comparative Examples 6 to 8, could each form a photoresist film small in the number of defects.

INDUSTRIAL APPLICABILITY

The composition for formation of upper layer film, of the present invention comprises the resin (A) and the resin (B). Therefore, the present composition can form an upper layer film which protects a photoresist film in liquid immersion exposure, which causes no dissolution in liquid medium (e.g. water) and keeps a stable film state, which effectively suppresses the generation of defects (e.g. water mark defect and inferior pattern), which enables formation of high-resolution resist pattern, and which has a sufficiently high receded contact angle. As a result, the present composition can hereafter effectively suppress the generation of defects (e.g. water mark defect) even in the resist pattern formation at a high scan speed. Accordingly, the present composition for formation of upper layer film can form an upper layer film preferably used in liquid immersion exposure and can be used quite preferably in the future production process of semiconductor device anticipated to become even finer.

The method for formation of photoresist pattern, of the present invention can be preferably used in the production process of semiconductor element or the like, which employs liquid immersin exposure.

The invention claimed is:

1. A method for formation of photoresist pattern, comprising a step of coating a photoresist composition on a substrate to form a photoresist film;

a step of coating, on the photoresist film, a composition for formation of upper layer film to form an upper layer film; and a step of placing a liquid immersion medium between the upper layer film and a lens, applying an exposure ray to the photoresist film and the upper layer film via the liquid immersion medium and a mask having a particular pattern, then conducting development to obtain a resist pattern, wherein the composition for formation of upper layer film comprises:

a resin (A) having a repeating unit represented by a following general formula (1-1) and not having a repeating unit represented by a following general formula (1-2); and a resin (B) having a repeating unit represented by the following general formula (1-2) and not having a repeating unit represented by the following general formula (1-1),

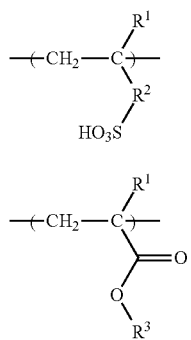

(1-1)

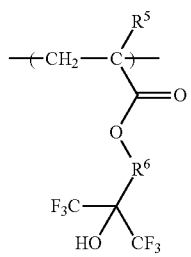

(2-1)

(1-2)

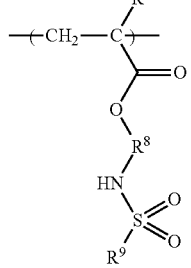

(2-2)

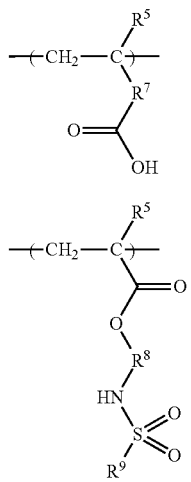

(2-3)

wherein, in the above general formulas (1-1) and (1-2), $R^1$ is a hydrogen atom, a methyl group or a trifluoromethyl group; $R^2$ is a single bond, a methylene group, a linear or branched alkylene group having 2 to 6 carbon atoms, or a group represented by a general formula $C(O)XR^4$, wherein X is an oxygen atom, a sulfur atom or an NH group and $R^4$ is a methylene group, or a linear or branched alkylene group having 2 to 6 carbon atoms; and $R^3$ is a linear or branched alkyl group of 1 to 12 carbon atoms, in which at least one hydrogen atom is substituted with a fluorine atom, or an alkyl group of alicyclic structure, having 1 to 12 carbon atoms, in which at least one hydrogen atom is substituted with a fluorine atom.

2. The method according to claim 1, wherein when the composition for formation of upper layer film is coated on a surface of a photoresist film and subjected to preliminary firing at 50 to 150° C. for 1 to 360 seconds to form an upper layer film, the upper layer film has a receded contact angle θ of 70° or more to water as measured under a following condition (θ), in which a water droplet of 25 μL formed on the upper layer film is sucked at a rate of 10 μL/min.

3. The method according to claim 2, wherein the photoresist composition comprises: a resin (X) containing an acid-dissociable group; and an acid-generating agent (Y), the resin (X) has an acid-dissociable group-containing repeating unit, and an amount of the acid-dissociable group-containing repeating unit is 30 to 60 mol % of a total amount of repeating units included in the resin (X).

4. The method according to claim 2, wherein either or both of the resin (A) and the resin (B) have each independently at least one kind of repeating unit selected from the group consisting of following general formulas (2-1), (2-2) and (2-3)

wherein, in the general formulas (2-1), (2-2) and (2-3), $R^5$ is hydrogen, a methyl group or a trifluoromethyl group; $R^6$, $R^7$ and $R^8$ are each independently a single bond, a methylene group, a linear or branched alkylene group having 2 to 6 carbon atoms, or an alicyclic alkylene group having 4 to 12 carbon atoms; and $R^9$ is a linear or branched alkyl group of 1 to 10 carbon atoms, in which at least one hydrogen atom is substituted with a fluorine atom, or an alicyclic alkyl group having 3 to 10 carbon atoms.

5. The method according to claim 2, wherein a mass ratio of the resin (A) to the resin (B), [resin (A)/resin (B)] is 0.3 or more.

* * * * *